(12) United States Patent
Chen et al.

(10) Patent No.: US 12,142,499 B2
(45) Date of Patent: Nov. 12, 2024

(54) PICKUP APPARATUS AND METHOD OF USING THE SAME

(71) Applicant: Taiwan Semiconductor Manufacturing Company, Ltd., Hsinchu (TW)

(72) Inventors: Yi-Jung Chen, Yilan County (TW); Tsung-Fu Tsai, Changhua County (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 83 days.

(21) Appl. No.: 17/577,337

(22) Filed: Jan. 17, 2022

(65) Prior Publication Data

US 2022/0406627 A1    Dec. 22, 2022

Related U.S. Application Data

(60) Provisional application No. 63/212,118, filed on Jun. 18, 2021.

(51) Int. Cl.
*H01L 21/67* (2006.01)
*H01L 21/683* (2006.01)

(52) U.S. Cl.
CPC .... *H01L 21/67132* (2013.01); *H01L 21/6836* (2013.01); *H01L 2221/68354* (2013.01); *H01L 2221/68381* (2013.01)

(58) Field of Classification Search
CPC ......... H01L 21/67115; H01L 21/67132; H01L 21/6836; H01L 2221/68354; H01L 2221/68381; H01L 2223/54426; H01L 2223/54473; H01L 2224/18; H01L 23/544
See application file for complete search history.

(56) References Cited

U.S. PATENT DOCUMENTS

| | | | | |
|---|---|---|---|---|
| 6,297,075 | B1 * | 10/2001 | Odajima | H01L 21/6836 438/464 |
| 2002/0197770 | A1 * | 12/2002 | Irie | H01L 21/561 438/464 |
| 2004/0089515 | A1 * | 5/2004 | Yoo | H01L 21/6836 198/438 |

(Continued)

FOREIGN PATENT DOCUMENTS

| | | | | |
|---|---|---|---|---|
| CN | 103155108 A | * | 6/2013 | ......... C08G 18/6229 |
| CN | 103871863 A | * | 6/2014 | ......... H01L 21/6836 |

(Continued)

OTHER PUBLICATIONS

English translation of WO200608824.*

(Continued)

*Primary Examiner* — Sonya M Sengupta
(74) *Attorney, Agent, or Firm* — JCIPRNET

(57) ABSTRACT

A pickup apparatus for separating a semiconductor die adhered on an adhesive film therefrom includes a frame, an UV light emitting element, and a collector element. The frame is configured to hold the adhesive film adhered with the semiconductor die thereon. The UV light emitting element is disposed inside the frame, where the adhesive film is disposed between the semiconductor die and the UV light emitting element. The collector element is disposed over the frame.

20 Claims, 23 Drawing Sheets

(56) References Cited

U.S. PATENT DOCUMENTS

| | | | |
|---|---|---|---|
| 2006/0252233 A1* | 11/2006 | Honma | H01L 21/67132 |
| | | | 438/464 |
| 2009/0000109 A1 | 1/2009 | Ozono et al. | |
| 2010/0129986 A1* | 5/2010 | Kamiya | B32B 27/365 |
| | | | 438/464 |
| 2011/0207253 A1 | 8/2011 | Yang | |
| 2021/0043514 A1 | 2/2021 | Harada et al. | |
| 2022/0406627 A1* | 12/2022 | Chen | H01L 21/67115 |

FOREIGN PATENT DOCUMENTS

| | | | | |
|---|---|---|---|---|
| EP | 2133170 A1 * | 12/2009 | | B23K 26/18 |
| JP | 2009135377 A * | 6/2009 | | C08G 18/6229 |
| WO | WO-2010064376 A1 * | 6/2010 | | C09J 7/02 |

OTHER PUBLICATIONS

English translation of Office Action for TW11220321150.*
English translation of CN103871863.*
English translation of CN103155108.*
English translation of WO2010064376.*
English translation of EP2133170.*
English translation of WO03077310.*
English translation of ES2285634.*
Translation of Office Action for TW111113662.*
Translation of WO03077310 (Year: 2003).*
Translation of JP2001345368 (Year: 2001).*
"Office Action of Taiwan Counterpart Application", issued on Apr. 10, 2023, p. 1-p. 8.

* cited by examiner

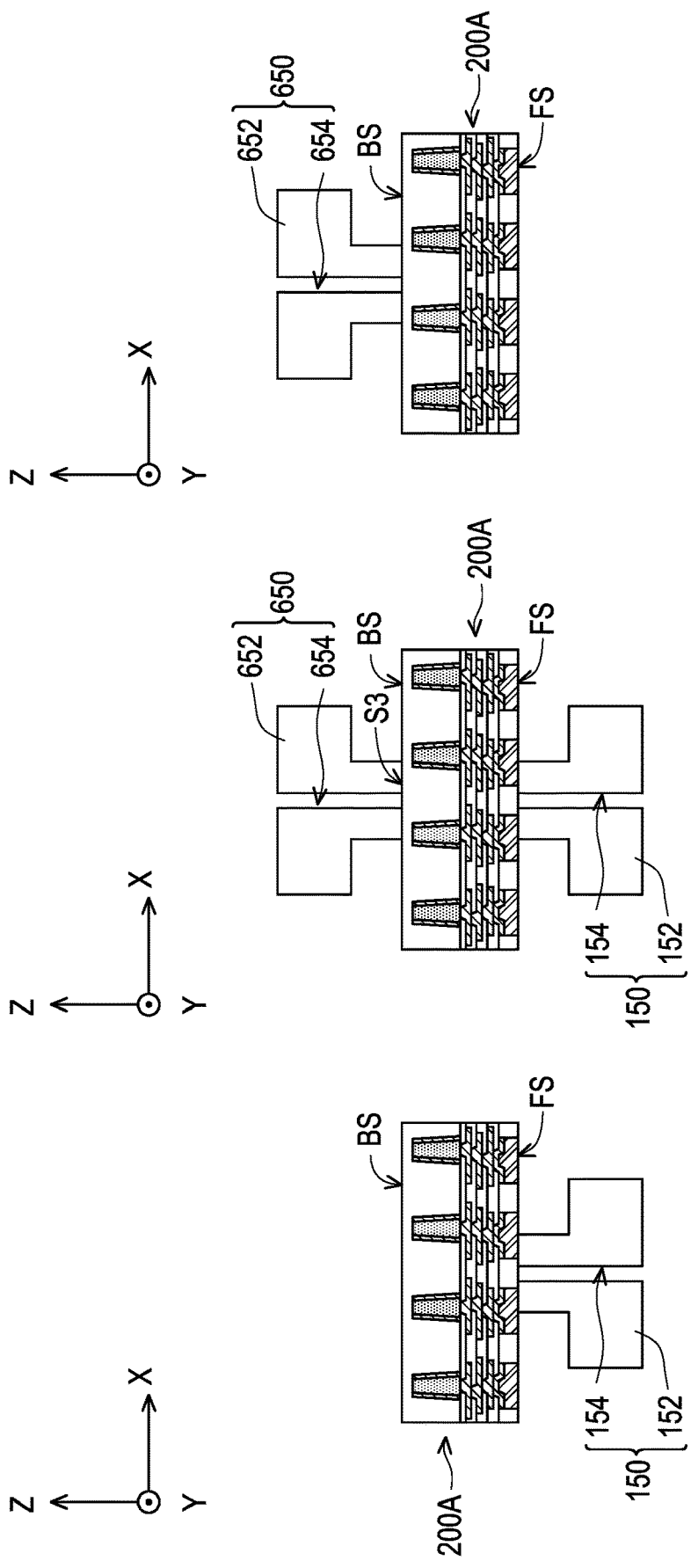

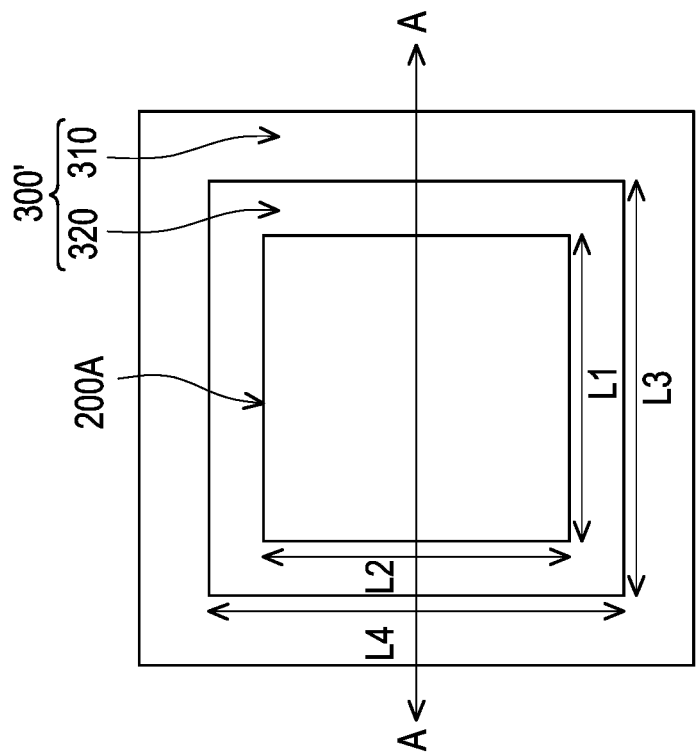
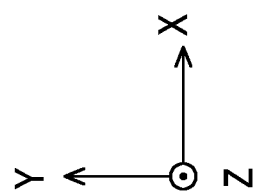
FIG. 15

PICKUP APPARATUS AND METHOD OF USING THE SAME

CROSS-REFERENCE TO RELATED APPLICATION

This application claims the priority benefit of U.S. provisional applications Ser. No. 63/212,118, filed on Jun. 18, 2021. The entirety of the above-mentioned patent application is hereby incorporated by reference herein and made a part of this specification.

BACKGROUND

Developments in shrinking sizes of semiconductor devices and electronic components make the integration of more devices and components having much smaller and thinner dimensions into a given volume possible and lead to high integration density of various semiconductor devices and/or electronic components. During the integration, the transportation of the devices and components have been developed.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 11 are schematic cross-sectional views showing a method of using a pickup apparatus during manufacturing a semiconductor device in accordance with some embodiments of the disclosure.

FIG. 15 is a schematic top view showing a positioning configuration of a semiconductor die and an adhesive layer in accordance with some embodiments of the disclosure.

DETAILED DESCRIPTION

Figure 1:
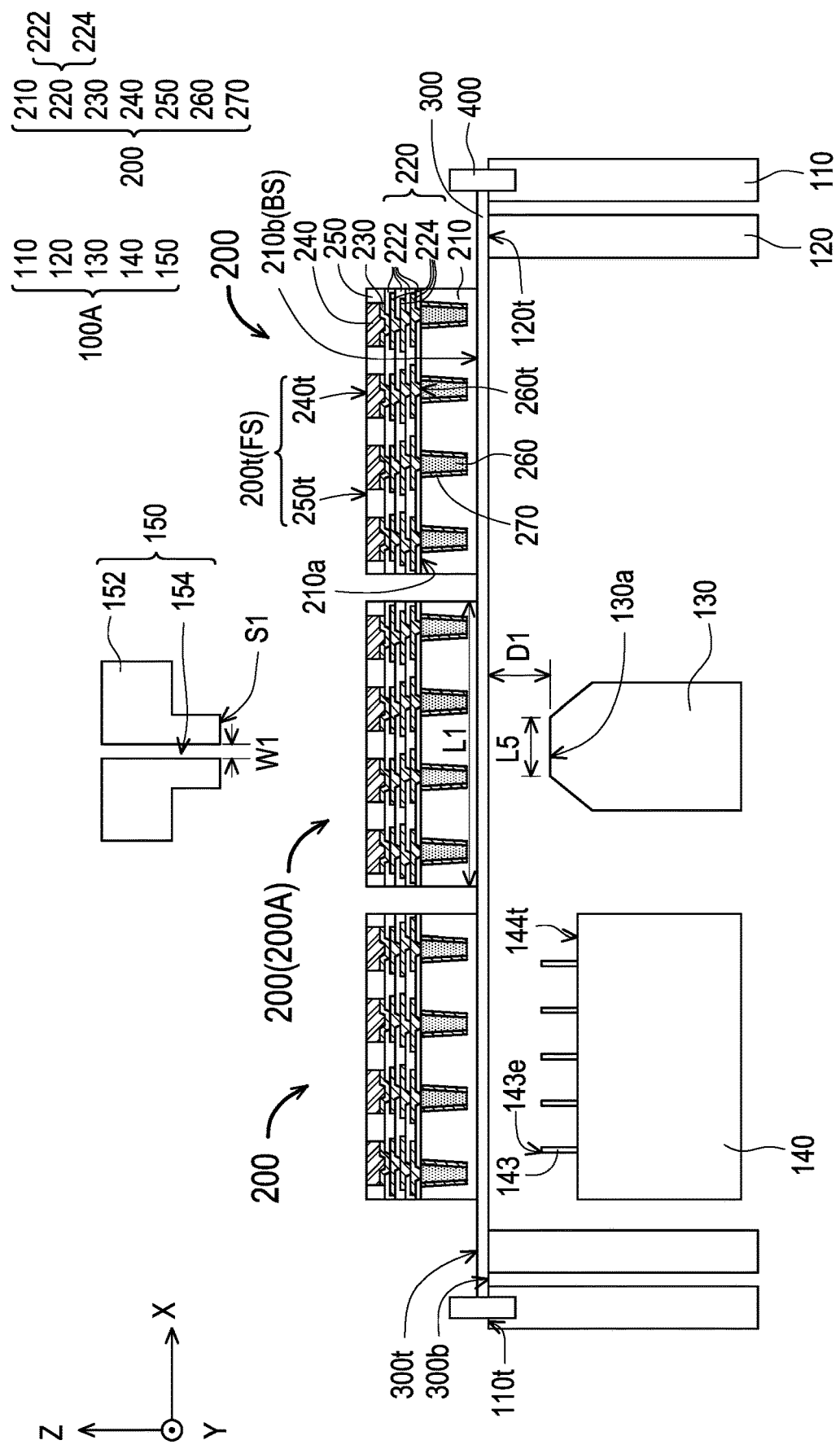

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

It should be appreciated that the following embodiment(s) of the disclosure provides applicable concepts that can be embodied in a wide variety of specific contexts. The specific embodiment(s) discussed herein is merely illustrative and is related to a pickup apparatus and its using method during a manufacture of a semiconductor device, such as a semiconductor package or a semiconductor die (e.g. a system-on-integrated circuit (SoIC), or the like). In accordance with some embodiments, a pickup apparatus includes an ultraviolet (UV) light emitter installed therein, where a semiconductor chip (or die) is effectively peeled off from the adhesive film (or layer) via a collector element, after radiating an UV light to the adhesive film. For example, with the UV light emitter, the adhesive film loses its tack by undergoing a UV light exposure. Therefore, the risk of chip crack failure for larger chips (such as having an area of about 40 mm² or more), thinner chips (such as having an area of about 100 μm or less) or larger and thinner chips is reduced. In addition, the pickup apparatus may further include an ejector element including a plurality of pins, where the pins lift up the semiconductor chip and the adhesive film underneath thereof so to partially peel the semiconductor chip from the adhesive film, thereby facilitating a pick-up of the semiconductor chip from the adhesive film.

Figure 17:
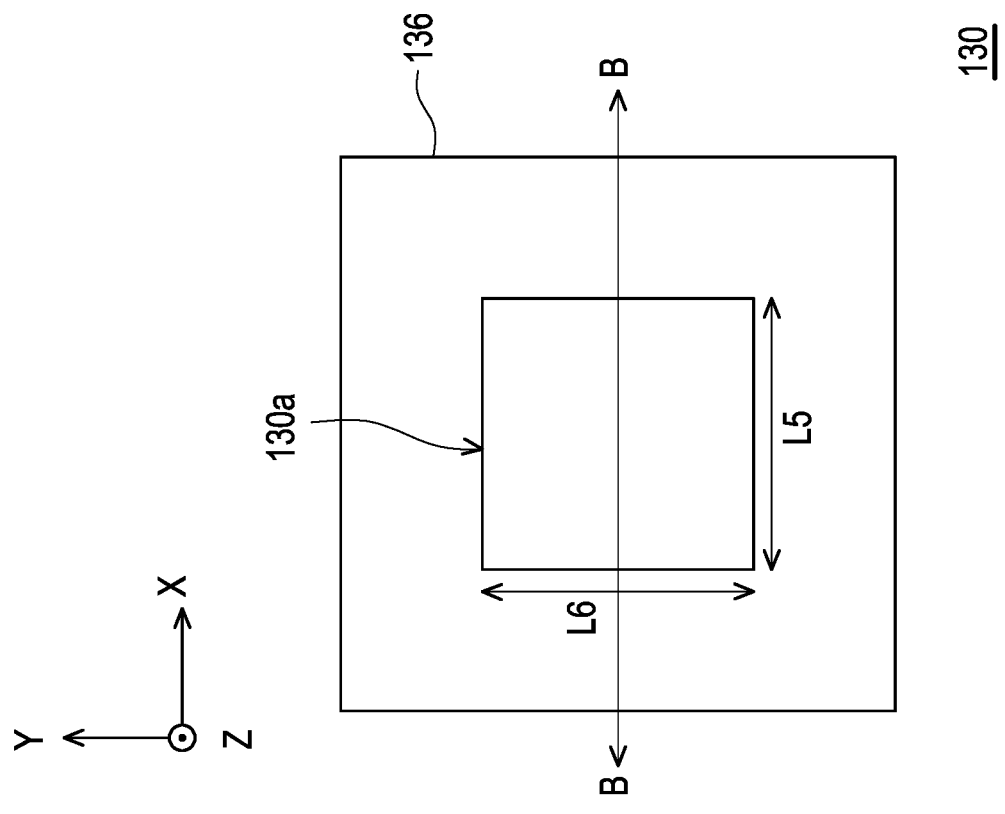
FIG. 16 and FIG. 17 are schematic cross-sectional and top views showing a light emitter of a pickup apparatus in accordance with some embodiments of the disclosure.
Figure 16:
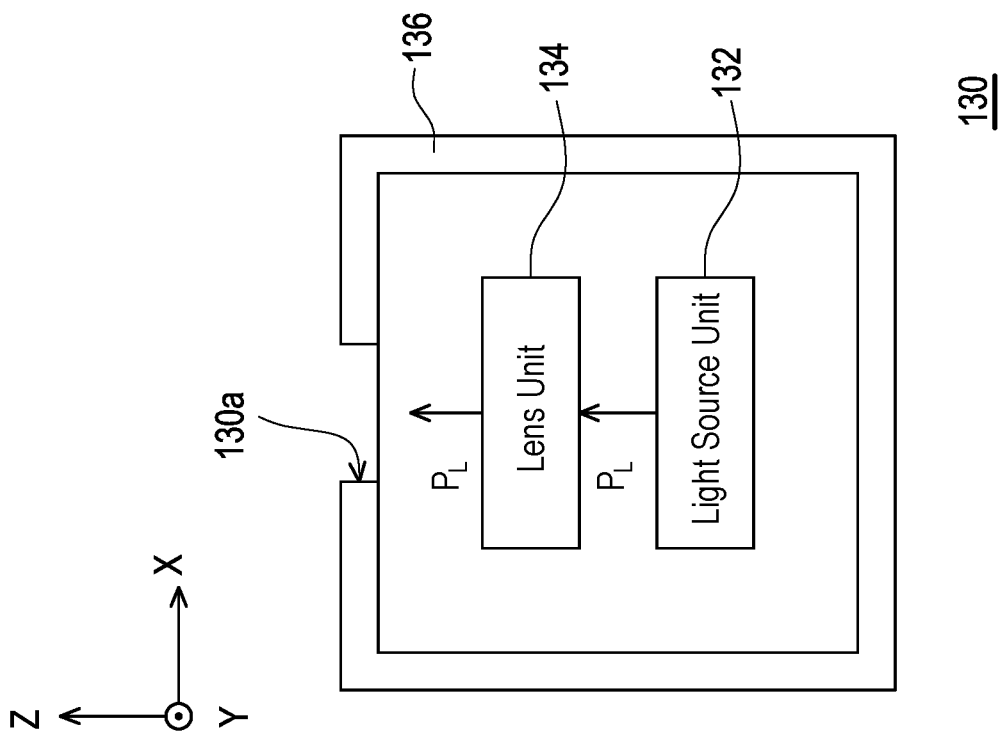
Figure 19:
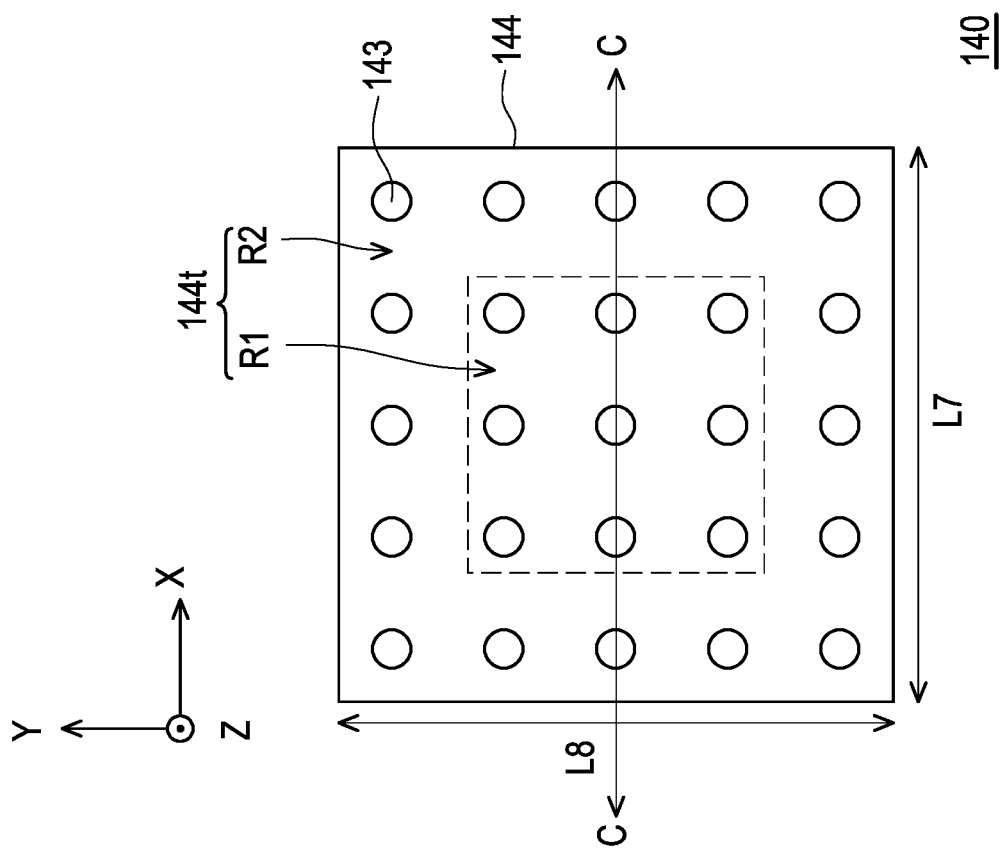
FIG. 18 and FIG. 19 are schematic cross-sectional and top views showing an ejector assembly of a pickup apparatus in accordance with some embodiments of the disclosure.
Figure 18:
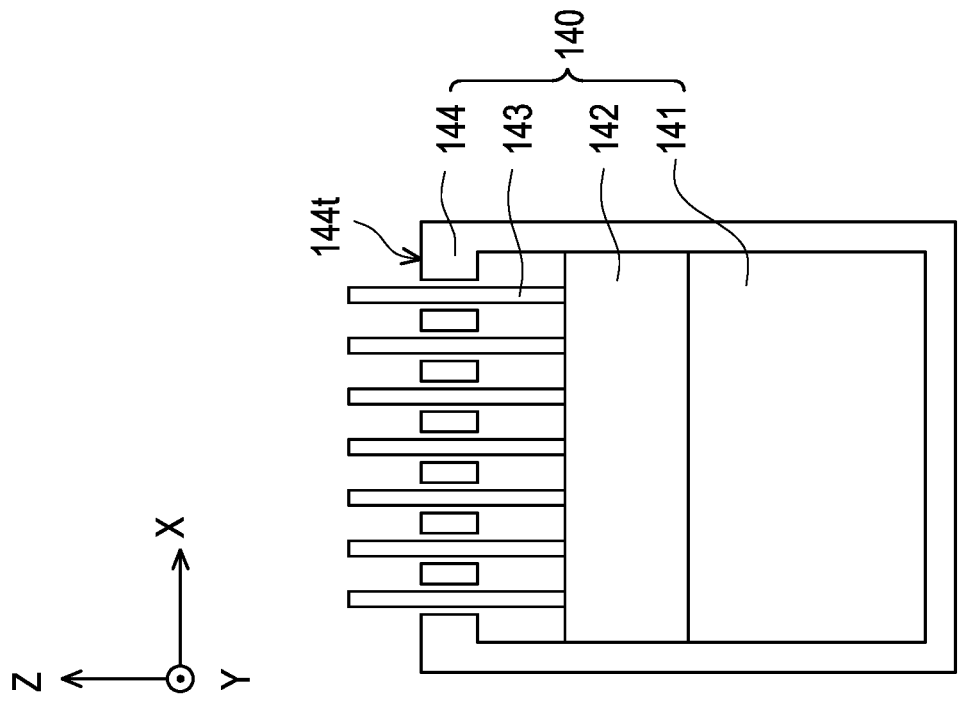
Figure 28:
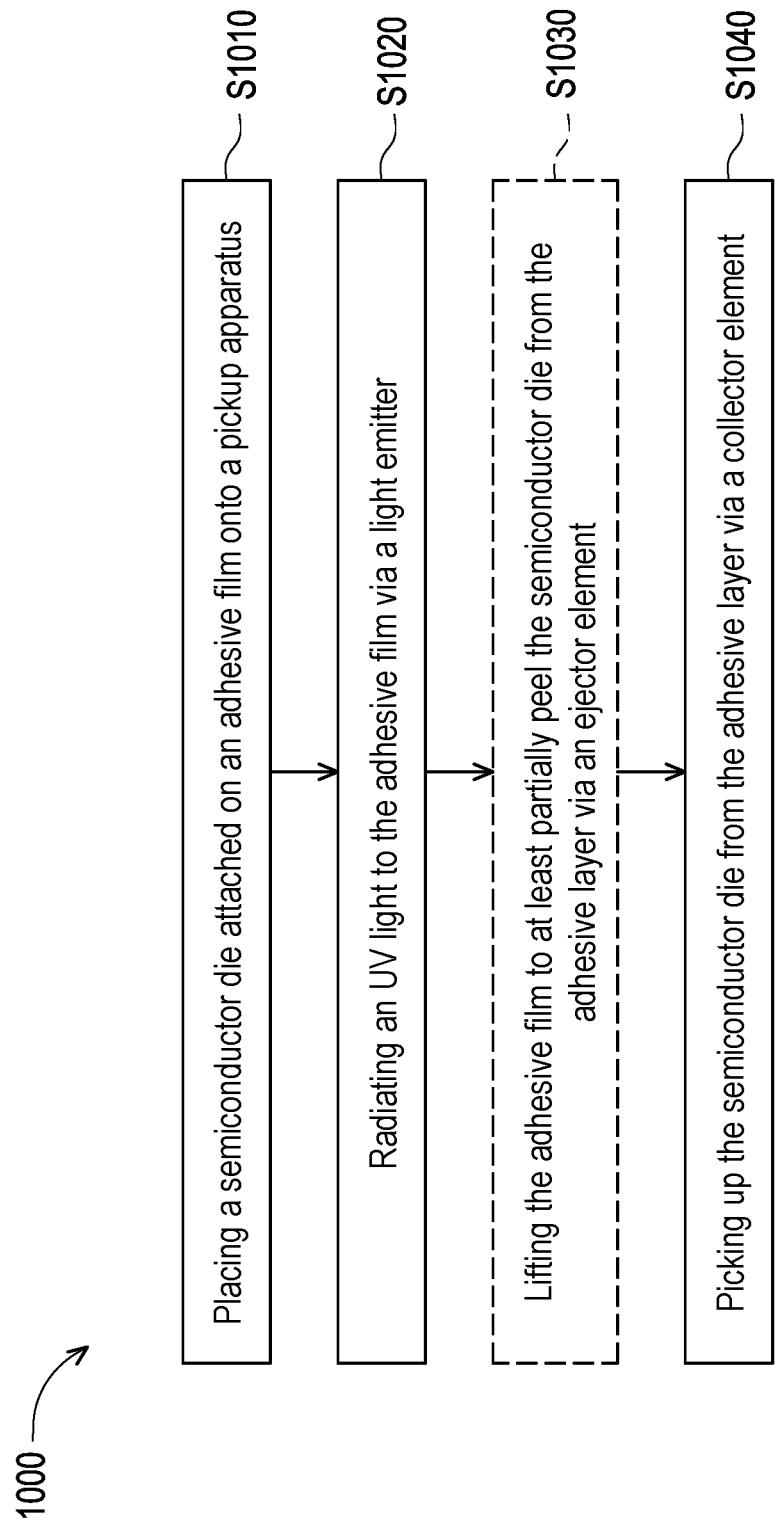
FIG. 28 illustrates a flowchart of a method for using a pickup apparatus during manufacturing a semiconductor device in accordance with some embodiments of the disclosure.

FIG. 1 through FIG. 11 are schematic cross-sectional views showing a method of using a pickup apparatus during manufacturing a semiconductor device in accordance with some embodiments of the disclosure. FIG. 15 is a schematic top view showing a positioning configuration of a semiconductor die and an adhesive layer in FIG. 2, where FIG. 1 through FIG. 11 are the cross-sectional views taken along a line AA depicted in FIG. 15. FIG. 16 and FIG. 17 are schematic cross-sectional and top views showing a light emitter of the pickup apparatus depicted in FIG. 1, where FIG. 16 is the cross-sectional view taken along a line BB depicted in FIG. 17. FIG. 18 and FIG. 19 are schematic cross-sectional and top views showing an ejector assembly of the pickup apparatus depicted in FIG. 1, where FIG. 18 is the cross-sectional view taken along a line CC depicted in FIG. 19. FIG. 28 illustrates a flowchart of a method for using a pickup apparatus during manufacturing a semiconductor device in accordance with some embodiments of the disclosure.

In some embodiments, one (semiconductor) chip or die is shown to represent plural (semiconductor) chips or dies of the wafer, and one semiconductor package is shown to represent plural semiconductor packages obtained following the (semiconductor) manufacturing method, the disclosure is not limited thereto. In other embodiments, one or more (semiconductor) chips or dies are shown to represent plural (semiconductor) chips or dies of the wafer, and one or more semiconductor packages are shown to represent plural semiconductor packages obtained following the (semiconductor) manufacturing method. In embodiments, the manufacturing method is part of a wafer level packaging process. It is to be noted that the process steps described herein cover a portion of the manufacturing processes used to fabricate a semiconductor package. The embodiments are intended to provide further explanations, but are not used to limit the scope of the disclosure.

Figure 11:
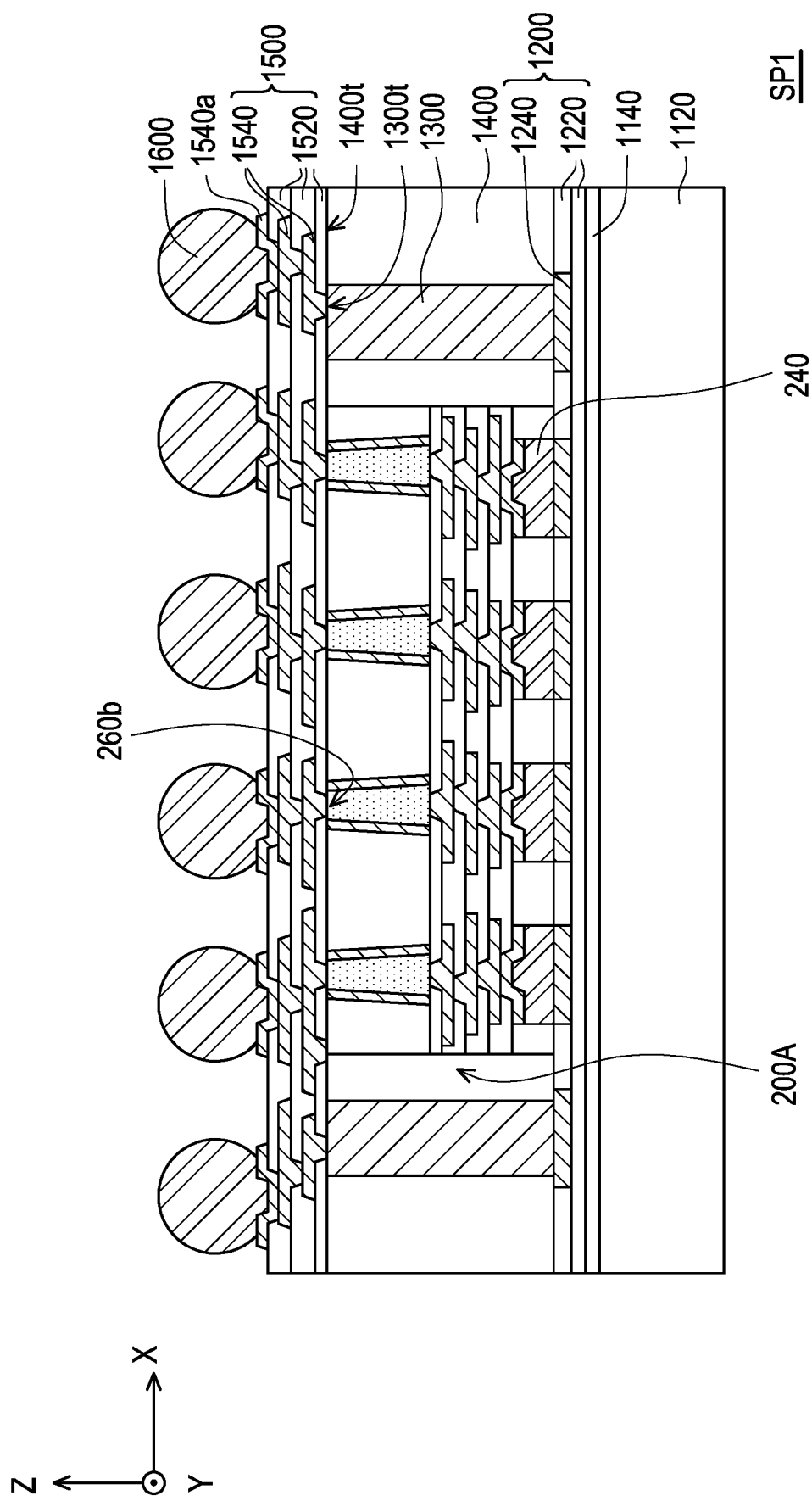

Referring to FIG. 1, in some embodiments, a method of using a pickup apparatus 100A during the manufacturing process of a semiconductor package SP1 (as shown in FIG. 11) includes following steps. First, a first wafer (not shown) including a plurality of semiconductor dies 200 is provided over a tape frame (not shown), and a dicing process is performed to cut the first wafer along a cutting line into individual and separated semiconductor dies 200. In one embodiment, the dicing process is a wafer dicing process including mechanical blade sawing or laser cutting. In some embodiments, before dicing/singulating, the semiconductor dies 200 included in the first wafer are tested for functionality and performance by probing, and only known good dies (KGDs) from the tested semiconductor dies 200 are selected and used for subsequently processing. In some embodiments, the known good dies (KGDs) from the tested semiconductor dies 200 are placed onto and adhered to an adhesive film 300 for subsequently processing. Only three semiconductor dies 200 being identified as KGDs provided in the adhesive film 300 are shown in FIG. 1 for illustrative purposes and for simplicity; the disclosure is not limited thereto. The adhesive film 300 is a continuous film, in some embodiments. The adhesive film 300 may include an UV tape, an UV film, or an UV adhesive film. The adhesive film 300 may be referred to as an adhesion film, an adhesion layer, or an adhesive layer.

In addition, before dicing/singulating, the semiconductor dies 200 may be arranged in an array in the first wafer. In some embodiments, the semiconductor dies 200 are arranged in the form of a matrix, such as a N×N array or a N×M array (N, M>0, N may or may not be equal to M) along a direction X and a direction Y. The direction X and the direction Y are not the same to each other and are perpendicular to each other, for example. That is, before dicing/singulating, the semiconductor dies 200 of the first wafer are connected to one another, in some embodiments.

As shown in FIG. 1, the semiconductor dies 200 independently may be referred to as a semiconductor die or chip including a digital chip, analog chip or mixed signal chip. In some embodiments, the semiconductor dies 200 independently are a logic die (e.g., a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller); a power management die (e.g., a power management integrated circuit (PMIC) die); a wireless and radio frequency (RF) die; a baseband (BB) die; a sensor die (e.g., a photo/image sensor chip); a micro-electro-mechanical-system (MEMS) die; a signal processing die (e.g., a digital signal processing (DSP) die); a front-end die (e.g., an analog front-end (AFE) die); an application-specific die (e.g., an application-specific integrated circuit (ASIC)); a field-programmable gate array (FPGA); a combination thereof; or the like. In alternative embodiments, the semiconductor dies 200 independently are a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, a wide I/O memory (WIO), a pre-stacked memory cube such as a hybrid memory cube (HMC) module, a high bandwidth memory (HBM) module; a combination thereof; or the like. In further alternative embodiments, the semiconductor dies 200 independently are an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoIC system, etc.; a combination thereof; or the like. In some other embodiments, the semiconductor dies 200 independently are an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The type of the semiconductor dies 200 may be selected and designated based on the demand and design requirement, and thus is not specifically limited in the disclosure.

In some embodiments, each of the semiconductor dies 200 includes a semiconductor substrate 210 having semiconductor elements (not shown) formed therein, an interconnect structure 220 formed on the semiconductor substrate 210, a plurality of connecting pads 230 formed on the interconnect structure 220, a plurality of connecting vias 240 formed on the connecting pads 230, a protection layer 250 covering the interconnect structure 220, the connecting pads 230 and sidewalls of the connecting vias 240, and a plurality of conductive pillars 260 formed (embedded) in the semiconductor substrate 210. In some embodiments, the semiconductor substrate 210 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 210 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained.

In some embodiments, the semiconductor substrate 210 includes the semiconductor elements formed therein or thereon, where the semiconductor elements include active devices (e.g., transistors, diodes, etc.) and/or passive devices (e.g., capacitors, resistors, inductors, etc.), or other suitable electrical components. In some embodiments, the semiconductor elements are formed at an active surface 210a of the semiconductor substrate 210 proximal to the interconnect structure 220. In some embodiments, as shown in FIG. 1, the semiconductor substrate 210 has the active surface 210a and a bottom surface 210b opposite to the active surface 210a along a stacking direction Z of the interconnect structure 220 and the semiconductor substrate 210, and the interconnect structure 220 is disposed on and covers the active surface 210a of the semiconductor substrate 210. The stacking direction Z is different from and substantially perpendicular to the direction X and the direction Y, for example.

The semiconductor substrate 210 may include circuitry (not shown) formed in a front-end-of-line (FEOL), and the interconnect structure 220 may be formed in a back-end-of-line (BEOL). In some embodiments, the interconnect structure 220 includes an inter-layer dielectric (ILD) layer formed over the semiconductor substrate 210 and covering the semiconductor elements, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 220 includes one or more dielectric layers 222 and one or more metallization layers 224 in alternation. The metallization layers 224 may be embedded in the dielectric layers 222. In some embodiments, the interconnect structure 220 is electrically coupled to the semiconductor elements formed in and/or on the semiconductor substrate 210 to one another and to external components (e.g., test pads, bonding conductors, etc.) formed thereon. For example, the metallization layers 224 in the dielectric layers 222 route electrical signals between the semiconductor elements of the semiconductor substrate 210. The semiconductor elements and the metallization layers 224 are interconnected to perform one or more functions including memory structures (e.g., a memory cell), processing structures (e.g., a logic cell), input/output (I/O) circuitry (e.g. an I/O cell), or the like. The uppermost layer of the interconnect structure 220 may be a passivation layer made of one or more suitable dielectric materials such as silicon oxide, silicon nitride, low-k dielectrics, polyimide (PI), combinations of these, or the like. In some embodiments, as shown in FIG. 1, the passivation layer (e.g. the uppermost layer of the dielectric layers 222) of the interconnect structure 220 has an opening exposing at least a portion of a topmost layer of the metallization layers 224 for further electrical connection.

The dielectric layers 222 may be PI, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 222 are formed by suitable fabrication techniques such as spin-on coating, chemical vapor deposition (CVD), plasma-enhanced chemical vapor deposition (PECVD) or the like.

The metallization layers 224 may be made of conductive materials formed by electroplating or deposition, such as copper, copper alloy, aluminum, aluminum alloy, or combinations thereof, which may be patterned using a photolithography and etching process. In some embodiments, the metallization layers 224 are patterned copper layers or other suitable patterned metal layers. For example, may be metal lines, metal vias, metal pads, metal traces, etc. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The numbers of the dielectric layers 222 and the number of the metallization layers 224 are not limited in the disclosure, and may be selected and designated based on demand and design layout.

In some embodiments, as illustrated in FIG. 1, the connecting pads 230 are disposed over and electrically coupled to the topmost layer of the metallization layers 224 of the interconnect structure 220 exposed by the passivation layer (e.g. the uppermost layer of the dielectric layers 222) of the interconnect structure 220 for testing and/or further electrical connection. The connecting pads 230 may be made of aluminum, copper, or alloys thereof or the like, and may be formed by an electroplating process. The disclosure is not limited thereto. Some of the connecting pads 230 may be testing pads, and some of the connecting pads 230 may be conductive pads for further electrical connection. In some embodiments, the connecting pads 230 may be optional for simple structure and cost benefits. In some embodiments, the connecting vias 240 may directly connect to the uppermost metallization layers 224.

In some embodiments, the connecting vias 240 are respectively disposed on and electrically connected to the connecting pads 230 for providing an external electrical connection to the circuitry and semiconductor elements. In one embodiment, the connecting vias 240 may be formed of conductive materials such as copper, gold, aluminum, the like, or combinations thereof, and may be formed by an electroplating process or the like. The connecting vias 240 may be bond vias, bond pads or bond bumps, or combinations thereof. The disclosure is not limited thereto. The connecting vias 240 may serve as bonding conductors for further electrical connection and may be formed over the connecting pads 230 (serving as the conductive pads for further electrical connection). The connecting vias 240 may be electrically coupled to the semiconductor elements of the semiconductor substrate 210 through the interconnect structure 220 and the connecting pads 230.

In some embodiments, the protection layer 250 is formed on the interconnect structure 220 to cover the interconnect structure 220 and the connecting pads 230 and to laterally cover the connecting vias 240. That is to say, the protection layer 250 prevents any possible damage(s) occurring on the connecting pads 230 and the connecting vias 240 during the transfer of the first wafer. In addition, in some embodiments, the protection layer 250 further acts as a passivation layer for providing better planarization and evenness. In some embodiments, top surfaces 240t of the connecting vias 240 are substantially leveled with a surface 250t of the protection layer 250 for further electrical connection, as shown in FIG. 1. In some embodiments, the top surface 250t of the protection layer 250 and the top surfaces 240t of the connecting vias 240 may be referred to as a top surface 200t of the semiconductor dies 200. For example, the top surface 200t of the semiconductor die 200 is a front-side surface FS of the semiconductor die 200.

The protection layer 250 may include one or more layers of dielectric materials, such as silicon nitride, silicon oxide, high-density plasma (HDP) oxide, tetra-ethyl-ortho-silicate (TEOS), undoped silicate glass (USG), silicon oxynitride, PBO, PI, silicon carbon, silicon carbon oxynitride, diamond like carbon (DLC), and the like, or a combination thereof. It should be appreciated that the protection layer 250 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials.

In some embodiments, the conductive pillars 260 are embedded in the semiconductor substrate 210. For example, the conductive pillars 260 are formed in the semiconductor substrate 210 and extended from the active surface 210a towards the bottom surface 210b along the stacking direction Z. As shown in FIG. 1, top surfaces 260t of the conductive pillars 260 are substantially coplanar to the active surface 210a of the semiconductor substrate 210 to be in contact with a bottommost layer of the metallization layers 224 exposed by a lowest layer of the dielectric layers 222 of the interconnect structure 220. In some embodiments, the conductive pillars 260 are not accessibly revealed by the bottom surface 210b of the semiconductor substrate 210. For example, the bottom surface 210b of the semiconductor die 200 is a back-side surface BS of the semiconductor die 200. In some embodiments, the conductive pillars 260 may be tapered from the interconnect structure 220 to the bottom surface 210b. Alternatively, the conductive pillars 260 have substantially vertical sidewalls.

In a cross-sectional view along the stacking direction Z, the shape of the conductive pillars 260 may depend on the design requirements, and is not intended to be limiting in the disclosure. For example, in a top (plane) view on a X-Y plane perpendicular to the stacking direction Z, the shape of the conductive pillars 260 is circular shape. However, depending on the design requirements, and the shape of the conductive pillars 260 may be an oval shape, a rectangular shape, a polygonal shape, or combinations thereof; the disclosure is not limited thereto.

In some embodiments, the conductive pillars 260 are in physical contact with the bottommost layer of the metallization layers 224 of the interconnect structure 220 exposed by the lowest layer of the dielectric layers 222 of the interconnect structure 220 at the active surface 210a, as illustrated in FIG. 1. That is, the conductive pillars 260 are electrically connected to the semiconductor elements in the semiconductor substrate 210 through the interconnect structure 220, and are electrically connected to the connecting vias 240 through the interconnect structure 220 and the connecting pads 230. The conductive pillars 260 may be formed of a conductive material, such as copper, tungsten, aluminum, silver, combinations thereof, or the like.

In some embodiments, each of the conductive pillars 260 is covered by a liner 270. For example, the liners 270 are formed between the conductive pillars 260 and the semiconductor substrate 210. In some embodiments, a sidewall of each of the conductive pillars 260 may be covered by the respective one liner 270. In alternative embodiments, a bottom surface and the sidewall of each of the conductive pillars 260 may be covered by the respective one liner 270. The liners 270 may be formed of a barrier material, such as TiN, Ta, TaN, Ti, or the like. In alternative embodiments, a dielectric liner (not shown) (e.g., silicon nitride, an oxide, a polymer, a combination thereof, etc.) may be further optionally formed between the liners 270 and the semiconductor substrate 210. In some embodiments, the conductive pillars 260, the liners 270 and the optional dielectric liner are formed by forming recesses in the semiconductor substrate 210 and respectively depositing the dielectric material, the barrier material, and the conductive material in the recesses, removing excess materials on the semiconductor substrate 210. For example, the recesses of the semiconductor substrate 210 are lined with the dielectric liner so as to laterally separate the liners 270 lining sidewalls of the conductive pillars 260 from the semiconductor substrate 210. The conductive pillars 260 are formed by using a via-first approach, in certain embodiments. In such embodiments, the conductive pillars 260 are formed prior to the formation of the interconnect structure 220. As shown in FIG. 1, in some embodiments, the conductive pillars 260 are separated from the semiconductor substrate 210 through at least the liners 270. Alternatively, the liners 270 may be omitted. Or, alternatively, the conductive pillars 260 and the liners 270 may both be omitted.

Alternatively, the conductive pillars 260 may be formed by using a via-last approach, and may be formed after the formation of interconnect structure 220. The disclosure is not limited thereto. The number of the dielectric layers 222 and the numbers of the metallization layers 224 of the interconnect structure 220, the number of the connecting pads 230, the number of the connecting vias 240 and the number of the conductive pillars 260 within each of the semiconductor dies 200 are not limited to the disclosure, and may be selected and designated based on the demand and design layout.

Continued to FIG. 1, in some embodiment, the semiconductor dies 200 adhered to the adhesive film 300 are placed onto the pickup apparatus 100A, in accordance with step S1010 of a method 1000 in FIG. 28. In some embodiments, the pickup apparatus 100A includes a first frame element 110, a second frame element 120, a light emitting element 130, an ejector element 140 and a collector element 150. The adhesive film 300 may be fixed onto the pickup apparatus 100A through a loading element 400, where the loading element 400 may be disposed in or on the first frame element 110. As shown in FIG. 1, for example, the adhesive film 300 is installed onto the pickup apparatus 100A through at least partially inserting the loading element 400 into the first frame element 110, where an edge of the adhesive film 300 is clamped by the loading element 400. The loading element 400 may include a fastener such as a bolt, a flange ring, or the like. In some embodiments, the loading element 400 is further capable of moving the adhesive film 300 so to align a to-be-picked up semiconductor die 200 with the light emitting element 130 and the collector element 150 along the stacking direction Z. The to-be-picked up semiconductor die 200 is denoted as a semiconductor die 200A hereinafter, in the disclosure.

As shown in FIG. 1, the semiconductor dies 200 are disposed on (e.g. in physical contact with) a top surface 300*t* of the adhesive film 300, and a bottom surface 300*b* of the adhesive film 300 props against (e.g. in physical contact with) a top surface 110*t* of the first frame element 110. The bottom surface 300*b* of the adhesive film 300 may further prop against (e.g. in physical contact with) a top surface 120*t* of the second frame element 120. The top surface 300*t* is opposite to the bottom surface 300*b* along the stacking direction Z, for example.

In some embodiments, the second frame element 120 is surrounded by the first frame element 110. The first frame element 110 may be laterally spaced away from the second frame element 120. For example, an inner sidewall of the first frame element 110 is distant from an outer sidewall of the second frame element 120, as shown in FIG. 1. Alternatively, the first frame element 110 may be in contact with the second frame element 120. For example, the inner sidewall of the first frame element 110 is physically connected to the outer sidewall of the second frame element 120. In some embodiments, the first frame element 110 and the second frame element 120 are independently made of a material with a sufficient stiffness (which may be quantified by its Yong's modulus) for protecting elements disposed therein and for supporting elements disposed thereon. The material of the first frame element 110 and the second frame element 120 may include a dielectric material or a combination of dielectric material and conductive material. For example, the first frame element 110 and the second frame element 120 are made of a metallic material (such as a metal or a metal alloy). In one embodiment, the material of the first frame element 110 is the same as the material of the second frame element 120. In an alternative embodiment, the material of the first frame element 110 is different from the material of the second frame element 120.

The first frame element 110 and the second frame element 120 may stand on a base (not shown) and may be mechanically connected to each other through the base, such that an accommodating space may be confined for accommodating the light emitting element 130 and the ejector element 140. For example, the light emitting element 130 and the ejector element 140 are disposed inside the first frame element 110 and the second frame portion 120. The light emitting element 130 and the ejector element 140 may be surrounded by an inner sidewall of the second frame element 120 and below the top surface 110*t* of the first frame element 110 and the top surface 120*t* of the second frame element 120, as shown in FIG. 1. In other words, the light emitting element 130 and the ejector element 140 are under the adhesive film 300, as shown in FIG. 1, for example.

In some embodiments, the light emitting element 130 includes a light source unit 132, a lens unit 134, and a housing 136 having a light exiting port 130*a*, where the light source unit 132 and the lens unit 134 are disposed inside the housing 136, as shown in FIG. 1 and FIG. 16. In some embodiments, the light source unit 132 includes an UV light source emitting an UV light (e.g., L depicted in FIG. 2) having a wavelength of about 10 nm to about 400 nm at an intensity of about 100 J/cm² to about 1000 J/cm². For example, the light source unit 132 includes a light emitting diode (LED) lamp emitting an UV light. The light source unit 132 may be referred to as a UV erase or a UV light emitter. In some embodiments, the UV light emitted from the light source unit 132 has a light path PL for transmission and exits the light emitting element 130 by passing through the light exiting port 130*a*, where the lens unit 134 is disposed at the light path PL of the UV light emitted by the light source unit 132 and located between the light source unit 132 and the light exiting port 130*a* of the housing 136. That is, the lens unit 134 may be optically coupled to the light source unit 132. In some embodiments, the lens unit 134 includes at least one optical lens. For example, the lens unit 135 includes a brightness enhancement film (BEF), a light diffusion film (or a light diffuser film), any other suitable optical lens or film, or combinations thereof. The disclosure is not limited thereto; alternatively, the lens unit 134 may be omitted.

As shown in FIG. 1, FIG. 16 and FIG. 17, in a top (plane) view on the X-Y plane, a shape of the light exiting port 130*a* is a rectangular shape, where a first lateral size L5 along the direction X is approximately ranging from 5 mm to 50 mm, and a second lateral size L6 along the direction Y is approximately ranging from 5 mm to 50 mm. However, depending on the design requirements, and the shape of the light exiting port 130*a* may be an oval shape, a circular shape, an elliptical shape, or a square shape as long as an overall area of the light exiting port 130*a* is able to fulfill an area requirement confined by the first lateral size L5 and the second lateral size L6; the disclosure is not limited thereto. As shown in FIG. 1, the light exiting port 130*a* faces towards the top surface 110*t* of the first frame element 110 and the top surface 120*t* of the second frame element 120 and is distant from the bottom surface 300*b* of the adhesive film 300, for example. In some embodiment, the light exiting port 130*a* is distant from the bottom surface 300*b* of the adhesive film 300 by a distance D1, where the distance D1 is approximately ranging from 1 mm to 10 mm, although other suitable thickness may alternatively be utilized.

In some embodiments, the ejector element 140 includes a motor 141, a pin chuck 142, a plurality of pins 143, and a housing 144, where the motor 141, the pin chuck 142 and the pins 143 are disposed inside the housing 144, as shown in FIG. 1 and FIG. 18. In some embodiments, the pin chuck 142 is disposed on the motor 141, and the pins 143 are disposed on and partially embedded in the pin chuck 142 to connect with the motor 141. For example, the motor 141 is configured to lift and lower the pins 143 in respective with a top surface 144*t* of the housing 144 to control movements of the pins 143 as needed during the manufacture of the semiconductor package SP1. The pins 143 may be referred to as lifting pins or pick-up pins.

Figure 21:
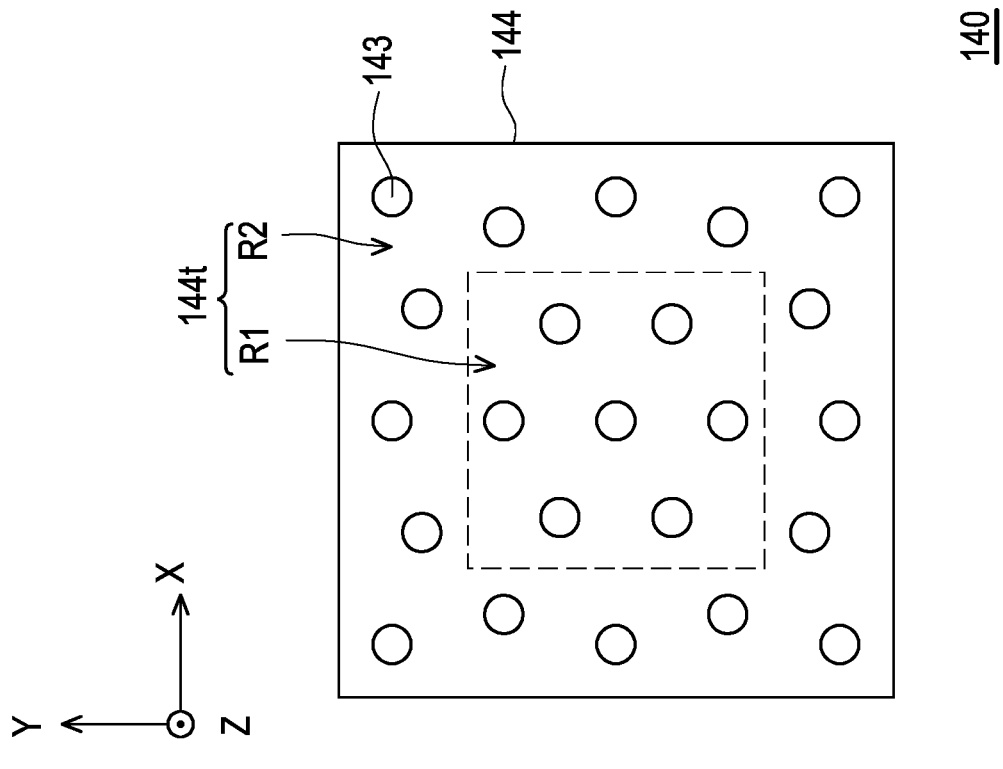
FIG. 20 through FIG. 21 are schematic top views showing an ejector assembly of a pickup apparatus in accordance with some alternative embodiments of the disclosure.
Figure 20:
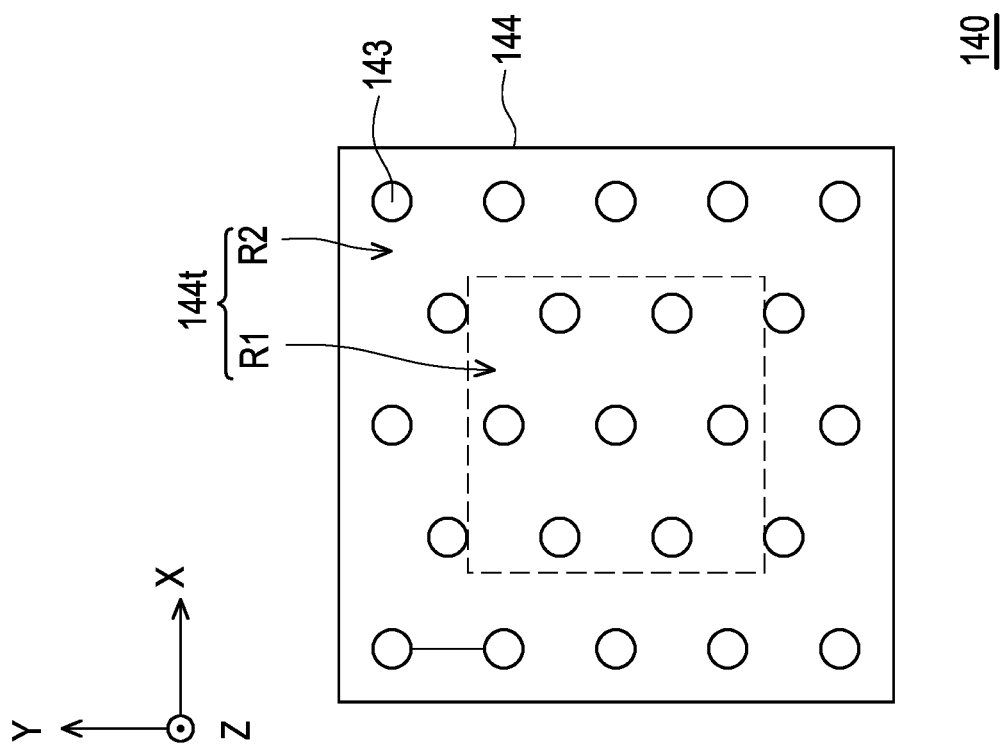

The pins 143 may partially protrude out the top surface 144*t* of the housing 144 and may face towards the top surface 110*t* of the first frame element 110 and the top surface 120*t* of the second frame element 120. For example, ends 143*e* of the portions of the pins 143 protrude out of the housing 144 and are located between the top surface 144*t* of the housing 144 and the top surfaces (e.g., 110*t* and 120*t*) of the first frame element 110 and the second frame element 120. In some embodiments, the top surface 144*t* of the housing 144 has a central region R1 and a peripherical region R2 surrounding the central region R1. The central region R1 may be enclosed by the peripherical region R2, as shown in FIG. 19. The pins 143 may be arranged in an array. In some embodiments, the pins 143 are arranged in the form of a matrix, such as a N'×N' array or a N'×M' array (N', M'>0, N' may or may not be equal to M') along the direction X and the direction Y. In some embodiments, the pins 143 arranged in immediately adjacent rows and/or columns are positioned in an alignment manner (e.g. an array form) on the X-Y plane, as shown in FIG. 19. In alternative embodiments, the pins 143 arranged in immediately adjacent rows and/or columns are positioned in a staggered manner (e.g. a staggered form) on the X-Y plane, as shown in FIG. 20. In further alternative embodiments, the pins 143 are arranged into a pre-determined pattern in a concentric manner, where at least one pin 143 is located at the central region R1 (e.g., a center thereof) and surrounded by the other pins 143 located at the peripherical region R2 on the X-Y plane, and the pins 143 located at the peripherical region R2 are in radial arrangement, as shown in FIG. 21.

In some embodiments, the pins 143 disposed in the central region R1 and the peripherical region R2 simultaneously move upwards. In alternative embodiments, the pins 143 disposed in the central region R1 simultaneously move upwards; thereafter, the pins 143 disposed in the peripherical region R2 simultaneously move upwards. In further alternative embodiments, the pins 143 disposed in the peripherical region R2 simultaneously move upwards; thereafter, the pins 143 disposed in the central region R1 simultaneously move upwards. In yet alternative embodiments, the pins 143 gradually move upwards in a direction from the center of the central region R1 to an outer edge of the peripherical region R2. Alternatively, the pins 143 gradually move upwards in a direction from the outer edge of the peripherical region R2 to the center of the central region R1. In some other embodiments, only the pins 143 disposed in the central region R1 move upwards; or, only the pins 143 disposed in the peripherical region R2 move upwards. However, the disclosure is not limited thereto, in the above embodiments, the pins 143 in the central region R1 may, in part or all, move upwards, and the pins 143 in the peripherical region R2 may, in part or all, move upward.

As shown in FIG. 1, FIG. 18 and FIG. 19, in a top (plane) view on the X-Y plane, a shape of the ejector element 140 is a rectangular shape, where a first lateral size L7 along the direction X is approximately ranging from 20 mm to 40 mm, and a second lateral size L8 along the direction Y is approximately ranging from 20 mm to 40 mm. However, depending on the design requirements, and the shape of the ejector element 140 may be an oval shape, a circular shape, an elliptical shape, or a square shape as long as an overall area of the ejector element 140 is able to fulfill an area requirement confined by the first lateral size L7 and the second lateral size L8; the disclosure is not limited thereto.

In some embodiments, materials of the pin chuck 142, the pins 143 and the housing 144 independently include a metallic material, such as metal or metal alloy. For example, the pin chuck 142, the pins 143 and the housing 144 independently may be made of iron (Fe), chromium (Cr), nickel (Ni), Aluminum (Al), stainless steel, combinations thereof, or the like. The materials of the pin chuck 142, the pins 143, and the housing 144 may be the same. The disclosure is not limited thereto; alternatively, the materials of the pin chuck 142, the pins 143, and the housing 144 may be different, in part or all.

In some embodiments, the collector element 150 includes a body 152, a channel 154 embedded therein, and a vacuum element (not shown) connected to the channel 154, as shown in FIG. 1. For example, the vacuum element is configured to provide a vacuum force (e.g., generating a negative pressure) to the channel 154 for picking up the semiconductor die 200A. The channel 154 may be referred to as a vacuum path or a vacuum channel. For example, the channel 154 has an opening hole (not labelled, having a width W1) at a surface S1 of the body 152, where the surface S1 is facing to the semiconductor dies 200, as shown in FIG. 1. In some embodiments, a material of the body 152 includes a metallic material, such as metal or metal alloy. The material of the body 152 may be the same as the materials of the pin chuck 142, the pins 143, and the housing 144. The disclosure is not limited thereto; alternatively, the material of the body 152 may be different from the materials of the pin chuck 142, the pins 143, and the housing 144, in part or all.

Figure 2:
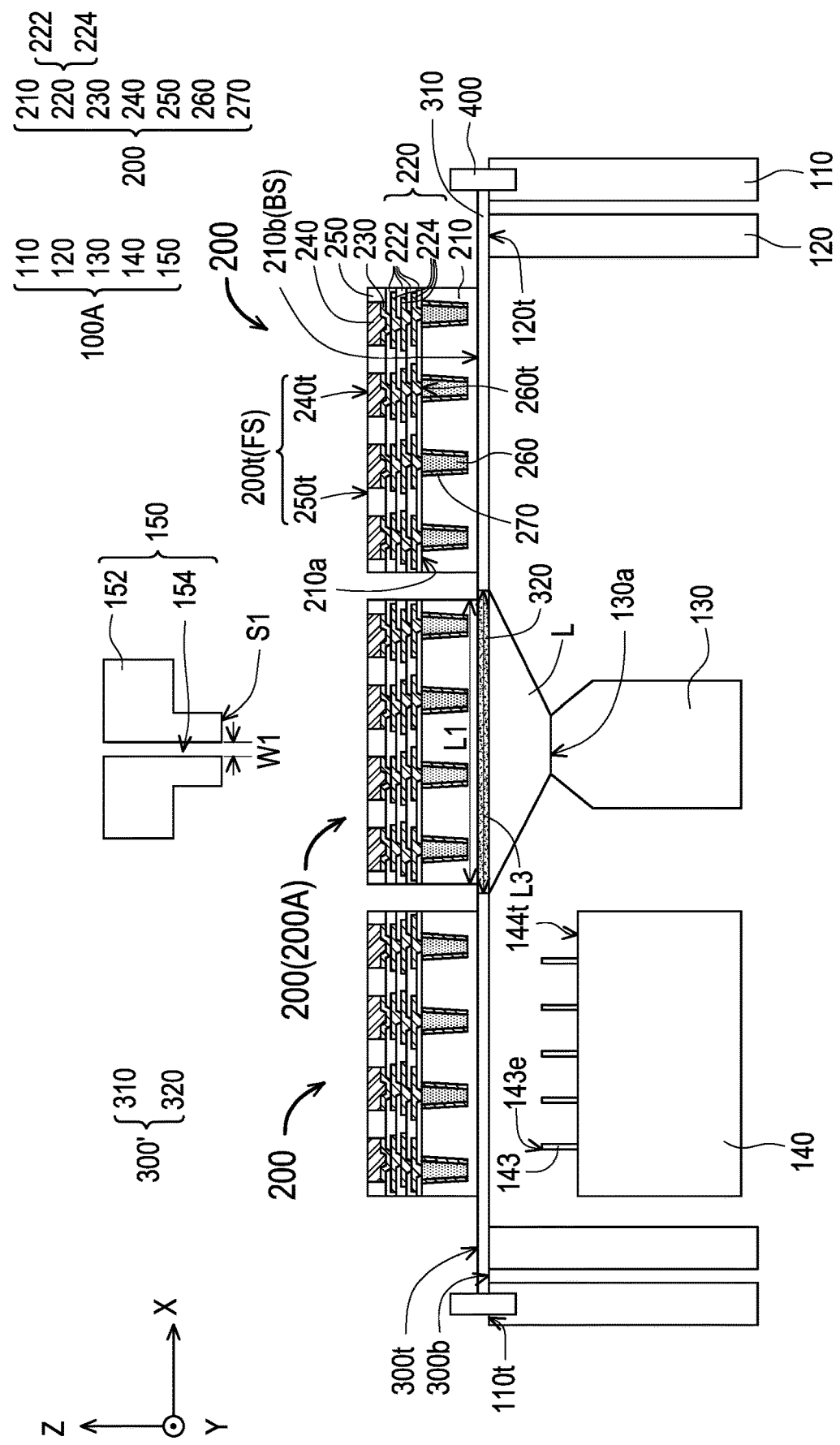

Referring to FIG. 2, in some embodiment, an UV light L is radiated onto the adhesive film 300, in accordance with a step S1020 of the method 1000 in FIG. 28. In some embodiments, the bottom surface 300b of the adhesive film 300 is partially radiated by the UV light L to form an adhesive film 300', where a portion of the adhesive film 300 not exposed to the UV light L forms a first portion 310 of the adhesive film 300' and a portion of the adhesive film 300 exposed to the UV light L forms a second portion 320 of the adhesive film 300'. As shown in FIG. 2, the adhesive film 300' is a continuous film, and the first portion 310 and the second portion 320 of the adhesive film 300' are connected to (e.g., in physical contact with) each other, for example. Referring to FIG. 2 and FIG. 15, the second portion 320 may be surrounded by the first portion 310. Since the second portion 320 is cured, the second portion 320 loses its adhesive property, thus the adhesion of the second portion 320 to the semiconductor die 200 (e.g., 200A) disposed thereon is sufficiently lowered while the adhesion of the first portion 310 to the semiconductor dies 200 (e.g., 200A) disposed thereon maintains the same (as the first portion 310 is not exposed to the UV light L).

The radiation of the UV light L (e.g., an UV light exposure or an (UV) radiating process) to the adhesive film 300 may be performed by, but not limited to, turning on the light emitting element 130 to emit the UV light L, exposing the adhesive film 300 to the UV light L for a processing time of about 0 second (e.g., greater than or equal to 0 second) to about 10 seconds (e.g., less than or equal to 10 seconds) at a room temperature (e.g., around 20 degrees Celsius to 25 degrees Celsius) so to fully cure the portion of the adhesive film 300 being exposed to the UV light L (so to form the second portion 320), and turning off the light emitting element 130. For example, the UV light L has a wavelength approximately ranging from 10 nm to 400 nm and with an intensity approximately ranging 100 $J/cm^2$ to 1000 $J/cm^2$.

In some embodiments, prior to turning on the light emitting element 130, the light emitting element 130 is moved right underlying the semiconductor die 200A, such that a center of the semiconductor die 200A is substantially aligned with a center of the light emitting element 130, where such configuration may be considered as a proper configuration for a pick-up process. Such proper configuration for the pick-up process may be referred to as a first configuration. With the first configuration, the light emitting element 130 and the semiconductor die 200A may be overlapped with each other along the stacking direction Z, as shown in FIG. 2. In some embodiments, the pickup apparatus 100A further includes a moving mechanism, where the light emitting element 130 is connected to the moving mechanism (not shown) to control the movement of the light emitting element 130. For example, the moving mechanism is configured to move the light emitting element 130 vertically along the direction Z and/or horizontally along the direction X and/or Y. The moving mechanism may include a mechanical arm.

In certain embodiments, during the radiation, the light emitting element 130, the semiconductor die 200A, and the collector element 150 are positioned in the first configuration. That is to say, the center of the light emitting element 130, the center of the semiconductor die 200A, and a center of the collector element 150 are substantially aligned with each other along the stacking direction Z, for example. The light emitting element 130, the semiconductor die 200A, and the collector element 150 may be overlapped with each other along the stacking direction Z, as shown in FIG. 2.

As shown in FIG. 2 and FIG. 15, certain structural feature including the semiconductor die 200A and the second portion 320 of the adhesive film 300' in the top (plane) view are stressed for illustration purposes. In some embodiments, in the top (plane) view on the X-Y plane, a shape of the semiconductor die 200A is a rectangular shape, where a first lateral size L1 along the direction X is approximately ranging from 1 mm to 10 mm, and a second lateral size L2 along the direction Y is approximately ranging from 1 mm to 10 mm. Depending on the design requirements, and the shape of the semiconductor die 200A may be an oval shape, a circular shape, an elliptical shape, or a square shape; the disclosure is not limited thereto. In some embodiments, in the top (plane) view on the X-Y plane, a shape of the second portion 320 is a rectangular shape having a first lateral size L3 along the direction X and a second lateral size L4 along the direction Y. For example, a ratio of the first lateral size L3 of the second portion 320 to the first lateral size L1 of the semiconductor die 200A is approximately ranging from 0.9 to 1.1. For example, a ratio of the second lateral size L4 of the second portion 320 to the second lateral size L2 of the semiconductor die 200A is approximately ranging from 0.9 to 1.1. Depending on the design requirements, and the shape of the second portion 320 may be an oval shape, a circular shape, an elliptical shape, or a square shape; the disclosure is not limited thereto.

As shown in FIG. 2, the first lateral size L3 of the second portion 320 may be greater than the first lateral size L1 of the semiconductor die 200A, and the second lateral size L4 of the second portion 320 may be greater than the second lateral size L2 of the semiconductor die 200A. Alternatively, the first lateral size L3 of the second portion 320 may be equal to the first lateral size L1 of the semiconductor die 200A, and the second lateral size L4 of the second portion 320 may be equal to the second lateral size L2 of the semiconductor die 200A. Or alternatively, the first lateral size L3 of the second portion 320 may be less than the first lateral size L1 of the semiconductor die 200A, and the second lateral size L4 of the second portion 320 may be less than the second lateral size L2 of the semiconductor die 200A. In some embodiments, the first lateral size L3 and the second lateral size L4 of the second portion 320 are independently less than, greater than or equal to the first lateral size L1 and the second lateral size L2 of the semiconductor die 200A, respectively; as long as it fulfills the requirement of above ratios. With above ratios, the adhesion of the second portion 320 to the semiconductor die 200 (e.g., 200A) disposed thereon is sufficiently lowered, thereby facilitating a pick-up of the semiconductor die 200 (e.g., 200A) from the second portion 320.

Figure 3:
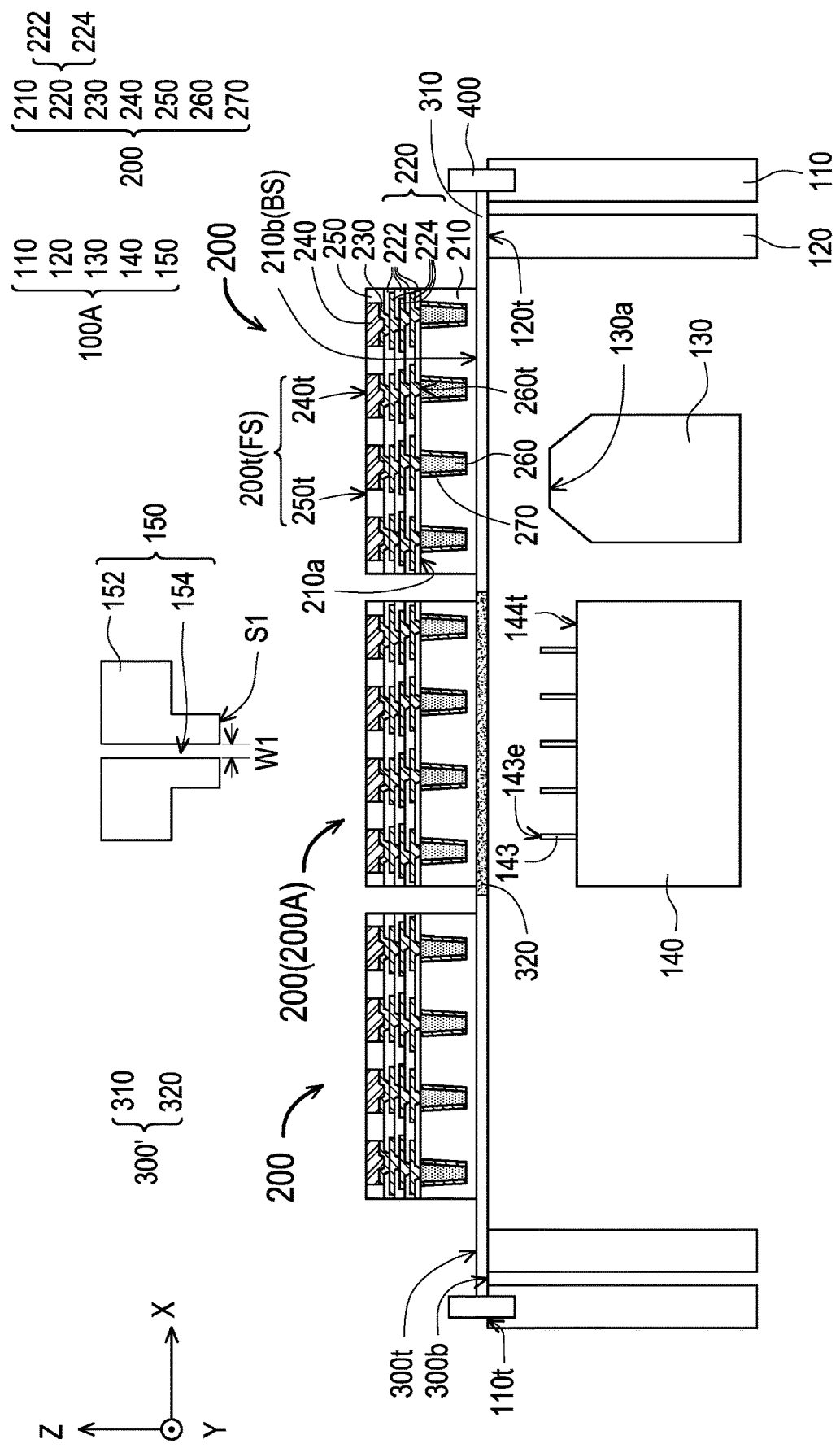

Referring to FIG. 3, in some embodiments, the ejector element 140 is positioned in the first configuration in respective with the semiconductor die 200A. A center of the ejector element 140 is substantially aligned with the center of the semiconductor die 200A along the stacking direction Z, for example. The ejector element 140 and the semiconductor die 200A may be overlapped with each other along the stacking direction Z, as shown in FIG. 3. In some embodiments, the pickup apparatus 100A further includes a moving mechanism, where the ejector element 140 is connected to the moving mechanism (not shown) to control the movement of the ejector element 140. For example, the moving mechanism is configurated to move the ejector element 140 vertically along the direction Z and/or horizontally along the direction X and/or Y. The moving mechanism may include a mechanical arm.

In certain embodiments, the ejector element 140, the semiconductor die 200A, and the collector element 150 are positioned in the first configuration. That is to say, the center of the ejector element 140, the center of the semiconductor die 200A, and the center of the collector element 150 are substantially aligned with each other along the stacking direction Z, for example. The ejector element 140, the semiconductor die 200A, and the collector element 150 may be overlapped with each other along the stacking direction Z, as shown in FIG. 3.

In some embodiments, prior to positioning the ejector element 140 in the first configuration in respective with the semiconductor die 200A, the light emitting element 130 is relocated to a second configuration, where with the second configuration, the light emitting element 130 is offset from (e.g., not overlapped with) the semiconductor die 200A. A positioning location of the light emitting element 130 is distant from (e.g., spaced away from) a positioning location of the semiconductor die 200A in a vertical projection along the direction Z, for example, as shown in FIG. 3.

Figure 4:
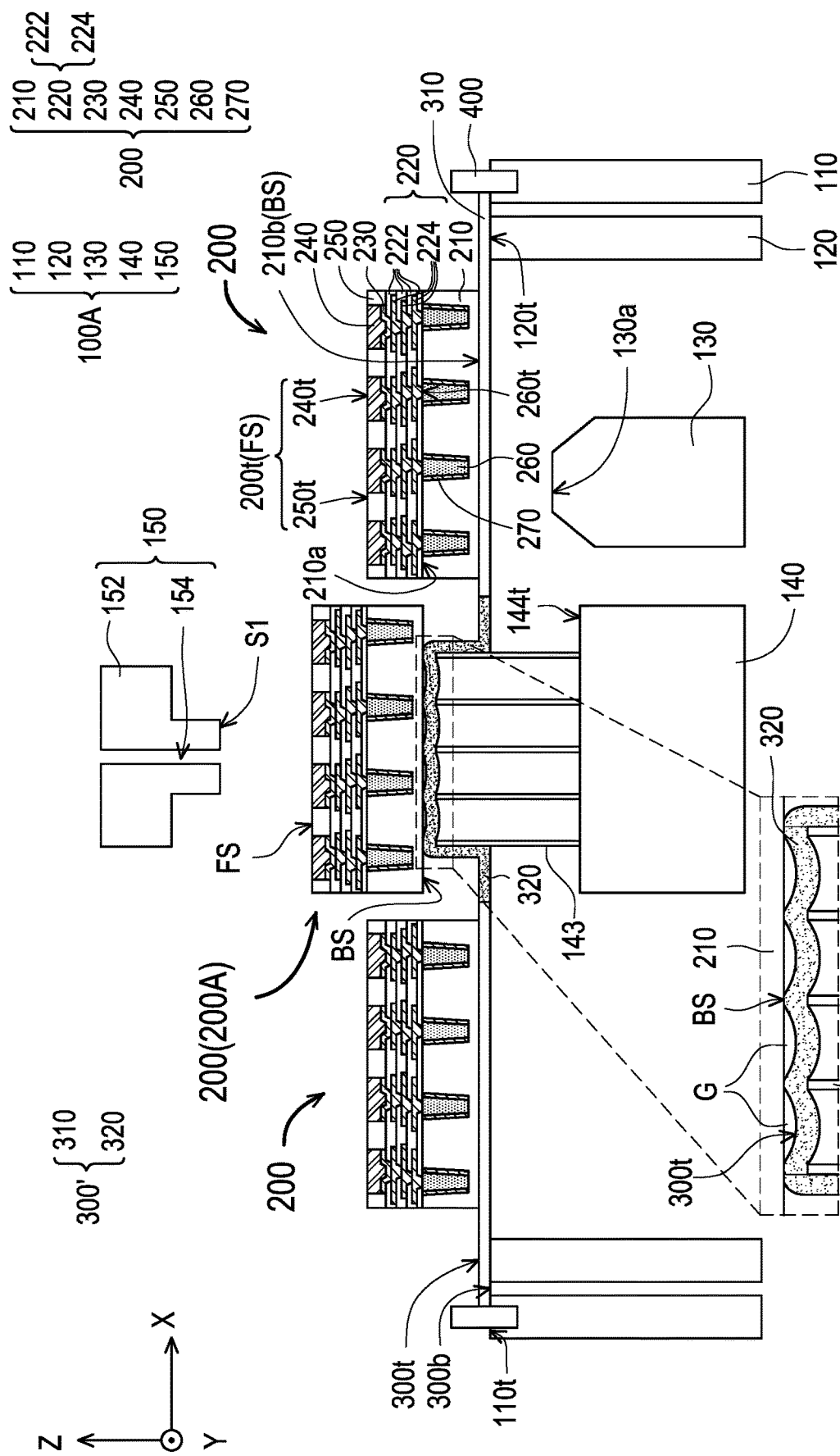

Referring to FIG. 4, in some embodiments, the adhesive film 300' is lifted up to at least partially peel the semiconductor die 200A from the adhesive film 300', in accordance with a step S1030 of the method 1000 in FIG. 28. In some embodiments, the pins 143 of the ejector element 140 are lifted up until the second portion 320 is pushed up to a position where there is a height difference between the second portion 320 and the first portion 310. For example, the ends 143e of the pins 143 are in physical contact with the bottom surface 300b of the second portion 320 of the adhesive film 300'. With such lifting process, portions of the second portion 320 prop against the pins 143 are still in contact with the back-side surface BS of the semiconductor die 200A, while rest of the second portion 320 free from the pins 143 (e.g., by a gap G) are peeled from the back-side surface BS of the semiconductor die 200A, as shown in FIG. 4. Owing to the ejector element 140, the adhesion of the second portion 320 to the semiconductor die 200 (e.g., 200A) disposed thereon is further lowered, thereby facilitating the pick-up of the semiconductor die 200 (e.g., 200A) from the second portion 320. The movements of the pins 143 has been previously described in FIG. 18 through FIG. 21, and thus are not repeated herein for brevity. In some embodiments, the lifting process is performed at 0 second (e.g., greater than or equal to 0 second) to 10 seconds (e.g., less than or equal to 10 seconds) after the radiating process.

Figure 5:
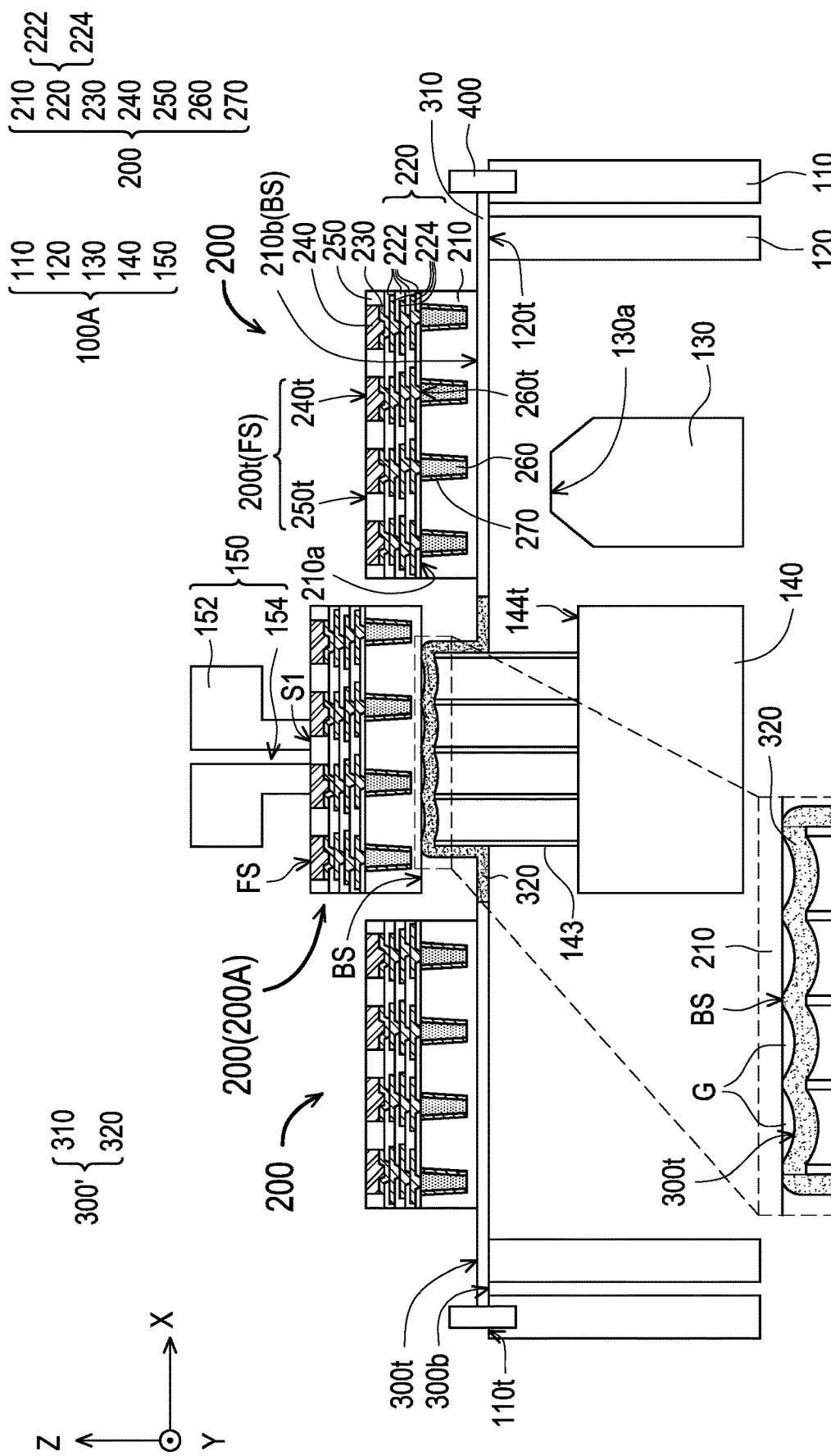
Figure 6:
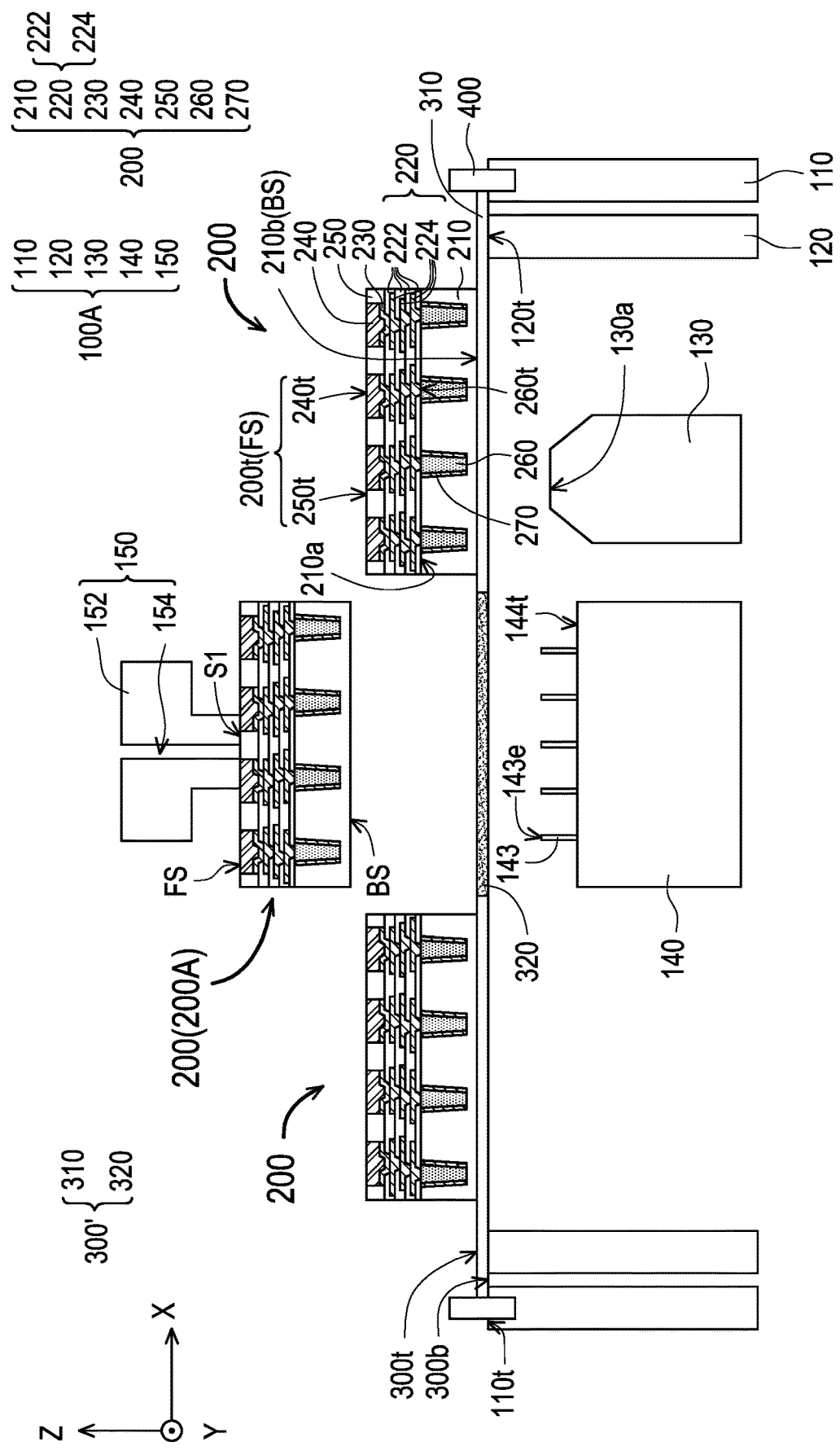

Referring to FIG. 5 and FIG. 6, in some embodiments, the semiconductor die 200A is removed (e.g., picked up) from the adhesive film 300' by the collector element 150, in accordance with a step S1040 of the method 1000 in FIG. 28. For example, the collector element 150 is moved down along the direction Z until the surface S1 of the collector element 150 is in (physical) contact with the front-side surface FS of the semiconductor die 200A, and the collector element 150 applies a vacuum force on the semiconductor die 200A through the channel 154, such that the semiconductor die 200A is held by the collector element 150 by a suction force, as shown in FIG. 5. As the semiconductor die 200A is held by the collector element 150, there is a direct contact therebetween. The collector element 150 may be referred to as a contact mode collector. Thereafter, the collector element 150 is moved up along the direction Z and the pins 143 of the ejector element 140 are then lowered to their initial position, in which the second portion 320 is also lowered back to its initial position where there is no height difference between the second portion 320 and the first portion 310, thereby the back-side surface BS of the semiconductor die 200A is completely peeled off from the top surface 300t of the second portion 320 of the adhesive film 300', as shown in FIG. 6, for example. Owing to the light emitting element 130 and the ejector element 140, the peeling strength between the second portion 320 and the semiconductor die 200 (e.g., 200A) disposed thereon is greatly decreased, the contact force between the surface S1 of the collector element 150 and the semiconductor die 200 (e.g., 200A) used for holding the semiconductor die 200 (e.g., 200A) can be lowered, thereby a damage to (e.g. the front-side surface FS of) the semiconductor die 200 (e.g., 200A) caused by residues (e.g. undesired particles) on the surface S1 of the collector element 150 can be suppressed and/or avoid. In addition, owing to the light emitting element 130 and the ejector element 140 of the pickup apparatus 100A, the peeling strength between the second portion 320 and the semiconductor die 200 (e.g., 200A) disposed thereon is greatly decreased, thereby facilitating a pick-up of the semiconductor die 200 (e.g., 200A) from the second portion 320 and suppressing damages (such as a crack) to the semiconductor die 200 (e.g., 200A).

In some embodiments, the pickup apparatus 100A further includes a moving mechanism, where the collector element 150 is connected to the moving mechanism (not shown) to control the movement of the collector element 150. For example, the moving mechanism is configured to move the collector element 150 vertically along the direction Z and/or horizontally along the direction X and/or Y. The moving mechanism may include a mechanical arm. In some embodiments, the collector element 150 is accurately moved to a position right overlying the semiconductor die 200A (e.g., the first configuration in respect with the semiconductor die 200A) by using an optical microscope (e.g. a detection of an intensity of light reflection of an alignment mark on the semiconductor die 200A) to determine the location of the semiconductor die 200A. In other words, the pickup apparatus 100A may include one or more than one optical microscope integrated in the collector element 150 or one or more than one optical microscope installed onto the moving mechanism next to the collector element 150. The alignment mark may include one or more metallic patterns formed on or in the semiconductor die 200A.

Referring to FIG. 6 and FIG. 7 together, in some embodiments, after the semiconductor die 200A is peeled off from (e.g. debonded from) the adhesive film 300' by the collector element 150, the collector element 150 and the semiconductor die 200A held therefrom are flipped (turned upside down). The back-side surface BS of the semiconductor die 200A is then facing up, for example.

Referring to FIG. 8, in some embodiments, a bonder element 650 is provided and placed over the semiconductor die 200A for picking the semiconductor die 200A from the collector element 150. In some embodiments, the bonder element 650 includes a body 652, a channel 654 embedded therein, and a vacuum element (not shown) connected to the channel 654, as shown in FIG. 8. For example, the vacuum element is configured to provide a vacuum force (e.g., generating a negative pressure) to the channel 654 for picking up the semiconductor die 200A. The channel 654 may be referred to as a vacuum path or a vacuum channel. For example, the channel 654 has an opening hole at a surface S3 of the body 652, where the surface S3 is facing to the semiconductor die 200A, as shown in FIG. 8. In some embodiments, a material of the body 652 includes a metallic material, such as metal or metal alloy. The material of the body 652 may be the same as the material of the material of the body 152. The disclosure is not limited thereto; alternatively, the material of the body 652 may be different from the material of the body 152.

In some embodiments, the surface S3 of the bonder element 650 is in contact with the back-side surface BS of the semiconductor die 200A, and the bonder element 650 applies a vacuum force on the semiconductor die 200A through the channel 654, such that the semiconductor die 200A is held by the bonder element 650 by direct contact, as shown in FIG. 8. In some embodiments, the bonder element 650 is accurately moved to a position right overlying the semiconductor die 200A (e.g., the first configuration in respect with the semiconductor die 200A) by using an optical microscope (e.g. a detection of an intensity of light reflection of an alignment mark on the semiconductor die 200A) to determine the location of the semiconductor die 200A. In other words, the pickup apparatus 100A may include one or more than one optical microscope integrated in the bonder element 650 or one or more than one optical microscope installed onto the moving mechanism next to the bonder element 650. The alignment mark may include one or more metallic patterns formed on or in the semiconductor die 200A. In some embodiments, the pickup apparatus 100A further includes a moving mechanism, where the bonder element 650 is connected to the moving mechanism (not shown) to control the movement of the bonder element 650. For example, the moving mechanism is configured to move the bonder element 650 vertically along the direction Z and/or horizontally along the direction X and/or Y. The moving mechanism may include a mechanical arm.

Referring to FIG. 8 and FIG. 9 together, in some embodiment, after the semiconductor die 200A is securely held by the bonder element 650 through the back-side surface BS, the semiconductor die 200A is released by the collector element 150 by releasing the front-side surface FS of the semiconductor from the surface S1 of the collector element 150. The bonder element 650 may be referred to as a bonder head.

In some embodiments, after the semiconductor die 200A is picked-up from the temporary holding element (such as the adhesive film 300) through the pickup apparatus 100A as described in FIG. 1 through FIG. 6 and is further transferred to be held by the bonder element 650 as described in FIG. 7 through FIG. 9, the semiconductor die 200A is placed over a carrier (e.g. 1120 depicted in FIG. 10) for manufacturing the semiconductor package SP1 as depicted in FIG. 11.

Figure 10:
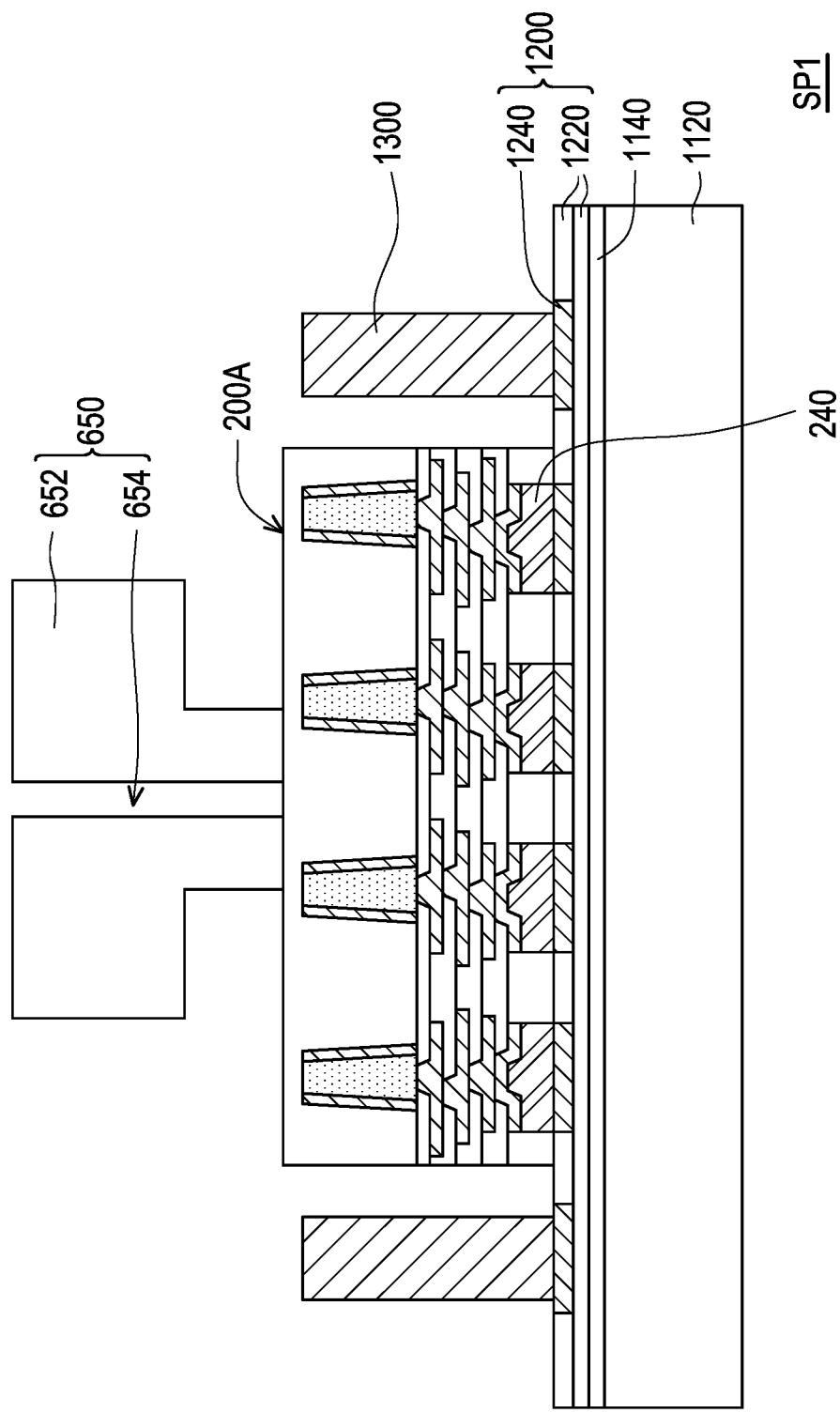

Referring to FIG. 10, in some embodiments, a carrier 1120 is provided, and a redistribution circuit structure 1200, a plurality of conductive pillars 1300 and the semiconductor die 200A are disposed over the carrier 1120. The details of the semiconductor die 200A have been previously described in FIG. 1, and thus are not repeated herein for brevity. In one embodiment, the carrier 1120 may be a glass carrier or any suitable carrier for carrying a semiconductor wafer or a reconstituted wafer for the manufacturing method of the semiconductor package. In an alternative embodiment, the carrier 1120 may be a reclaim wafer or a reconstituted wafer for the manufacturing method of the semiconductor package. For example, as the material of the carrier 1120 is a Si substrate, the carrier 1120 may serve as a heat dissipating element for the semiconductor package SP1. In such embodiments, the carrier 1120 may further be used for warpage control. In some alternative embodiments of which the carrier 1120 is removed after the manufacture of the semiconductor package, the carrier 1120 may further be coated with a debond layer 1140. For example, the debond layer 1140 is disposed on the carrier 1120, and the material of the debond layer 1140 may be any material suitable for bonding and debonding the carrier 1120 from the above layer(s) (e.g., the buffer layer) or any wafer(s) disposed thereon. In some embodiments, the debond layer 1140 may include a release layer (such as a light-to-heat conversion ("LTHC") layer) or an adhesive layer (such as an ultra-violet curable adhesive or a heat curable adhesive layer).

In some embodiments, a redistribution circuit structure 1200 is formed on the carrier 1120. The formation of the redistribution circuit structure 1200 may include sequentially forming one or more polymer dielectric layers 1220 and one or more metallization layers 1240 in alternation. For example, the redistribution circuit structure 1200 includes two polymer dielectric layers 1220 and one metallization layer 1240 as shown in FIG. 10; however, the disclosure is not limited thereto. The numbers of the metallization layers and the polymer dielectric layers included in the redistribution circuit structure 1200 are not limited thereto. For example, the numbers of the metallization layers and the polymer dielectric layers may be one or more than one. Due to the configuration of the polymer dielectric layers 1220 and the metallization layer 1240, a routing function is provided to the semiconductor package SP1.

For example, as shown in FIG. 10, the metallization layer 1240 is disposed over the carrier 1120 and sandwiched between the polymer dielectric layers 1220, where portions of a top surface of the metallization layer 1240 are exposed by a topmost layer of the polymer dielectric layers 1220 and a bottom surface of the metallization layer 1240 is covered by a bottommost layer of the polymer dielectric layers 1220. In some embodiments, the material of the polymer dielectric layers 1220 may include polyimide, epoxy resin, acrylic resin, phenol resin, benzocyclobutene (BCB), polybenzoxazole (PBO), or any other suitable polymer-based dielectric material, and the polymer dielectric layers 1220 may be formed by deposition. In some embodiments, the material of the metallization layer 1240 may include aluminum, titanium, copper, nickel, tungsten, and/or alloys thereof, and the metallization layer 1240 may be formed by electroplating or deposition. The disclosure is not limited thereto.

In some embodiments, as shown in FIG. 10, conductive pillars 1300 are formed on the redistribution circuit structure 1200. For example, the conductive pillars 1300 are physically connected to the portions of the top surface of the metallization layer 1240 exposed by the topmost layer of the polymer dielectric layers 1220. In other words, the conductive pillars 1300 are electrically connected to the redistribution circuit structure 1200. In some embodiments, the conductive pillars 1300 may be through integrated fan-out (InFO) vias. For simplification, only two conductive pillars 1300 are presented in FIG. 10 for illustrative purposes, however it should be noted that more than two through vias may be formed; the disclosure is not limited thereto. The number of the conductive pillars 1300 can be selected based on the demand.

In some embodiments, the conductive pillars 1300 are formed by photolithography, plating, photoresist stripping processes or any other suitable method. In one embodiment, the conductive pillars 1300 may be formed by forming a mask pattern (not shown) covering the redistribution circuit structure 1200 with openings exposing the top surface of the metallization layer 1240 exposed by the topmost layer of the polymer dielectric layers 1220, forming a metallic material filling the openings to form the conductive pillars 1300 by electroplating or deposition and then removing the mask pattern. In one embodiment, the material of the conductive pillars 1300 may include a metal material such as copper or copper alloys, or the like. However, the disclosure is not limited thereto.

In some embodiments, as shown in FIG. 10, the semiconductor die 200A is placed on the redistribution circuit structure 1200 by the bonder element 650. After the placing, the semiconductor die 200A may be released from the bonder element 650 to completely reveal the back-side surface BS of the semiconductor die 200A. In some embodiments, during the placing, the optical microscope (e.g. a detection of an intensity of light reflection of an alignment mark on the redistribution circuit structure 1200) of the bonder element 650 is employed to determine a location for disposing the semiconductor die 200A. The alignment mark may include one or more metallic patterns formed on or in the redistribution circuit structure 1200. Only one the semiconductor die 200A is shown in FIG. 10 for illustrative purposes, but the number of the semiconductor die 200A may be one or more based on the demand and the design requirement.

Thereafter, the semiconductor die 200A may be bonded to the redistribution circuit structure 1200. In some embodiments, a bonding process is performed to bond the semiconductor die 200A to the redistribution circuit structure 1200. For example, a bonding interface (not labeled) between the semiconductor die 200A and the redistribution circuit structure 1200 includes metal-to-metal bonding (e.g., copper-to-copper bonding) and dielectric-to-dielectric bonding (e.g., oxide-to-oxide bonding, oxide-to-nitride bonding, or nitride-to-nitride bonding). That is, the bonding process includes a hybrid bonding process, for example. In some embodiments, the connecting vias 240 of the semiconductor die 200A and the metallization layer 1240 of the redistribution circuit structure 1200 are bonded together through a direct metal-to-metal bonding, and the protection layer 250 of the semiconductor die 200A and the topmost layer of the polymer dielectric layers 1220 of the redistribution circuit structure 1200 are bonded together through a direct dielectrics-to-dielectrics bonding. In the disclosure, the bonding interface may be referred to as a hybrid bonding interface. In other words, the semiconductor die 200A are electrically connected to the redistribution circuit structure 1200, and at least some of the conductive pillars 1300 are electrically connected to the semiconductor die 200A through the redistribution circuit structure 1200. The redistribution circuit structure 1200 may be referred to as a front-side redistribution layer of the semiconductor die 200A.

In some embodiments, in the direction Z, the semiconductor die 200A may have a thickness greater than a height of the conductive pillars 1300, as shown in FIG. 10. However, the disclosure is not limited thereto. In an alternative embodiment, in the direction Z, the thickness of the semiconductor die 200A may be less than or substantially equal to the height of the conductive pillars 1300. As shown in FIG. 10, the semiconductor die 200A may be picked-up and placed on the redistribution circuit structure 1200 prior to the formation of the conductive pillars 1300. However, the disclosure is not limited thereto. In an alternative embodiment, the semiconductor die 200A may be picked-up and placed on the redistribution circuit structure 1200 after the formation of the conductive pillars 1300. The cross-sectional shape of the conductive pillars 1300 may be selected based on demand, and are not limited to the embodiments of the disclosure.

Referring to FIG. 11, in some embodiments, the semiconductor die 200A and the conductive pillars are encapsulated in an insulating encapsulation 1400, and a redistribution circuit structure 1500 and conductive terminals 1600 are sequentially formed on the insulating encapsulation 14000. In some embodiments, the redistribution circuit structure 1500 is electrically connected to the semiconductor die 200A through the conductive pillars 1300 and the redistribution circuit structure 1200. In some embodiments, some of the conductive terminals 1600 are electrically connected to the semiconductor die 200A through the redistribution circuit structure 1500, the conductive pillars 1300 and the redistribution circuit structure 1200.

The formation of the insulating encapsulation 1400 may include, but not limited to, forming the insulating encapsulation 1400 over the carrier 1120 (e.g., on the redistribution circuit structure 1200) to cover the redistribution circuit structure 1200 and to encapsulate the semiconductor die 200A and the conductive pillars 1300 (e.g., until the redistribution circuit structure 1200, the semiconductor die 200A and the conductive pillars 1300 being covered by and embedded in the insulating encapsulation 1400), and then planarizing the insulating encapsulation 1400 (e.g., until surfaces 260b of the conductive pillars 260 of the semiconductor die 200A and surfaces 1300t of the conductive pillars 1300 are exposed by a surface 1400t of the insulating encapsulation 1400). In some embodiments, the insulating encapsulation 1400 is a molding compound formed by a molding process, and the material of the insulating encapsulation 1400 may include epoxy or other suitable resins. For example, the insulating encapsulation 1400 may be epoxy resin containing chemical filler. During the planarized process of the insulating encapsulation 1400, the semiconductor substrate 210, the conductive pillars 260, and/or the liners 270 of the semiconductor die 200A and/or the conductive pillars 1300 may also be planarized. The insulating encapsulation 1400 may be formed by mechanical grinding process or chemical mechanical polishing (CMP) process, for example. After the planarizing process, a cleaning step may be optionally performed, for example to clean and remove the residue generated from the planarizing step. However, the disclosure is not limited thereto, and the planarizing step may be performed through any other suitable method.

The formation of the redistribution circuit structure 1500 may include, but not limited to, forming a plurality of polymer dielectric layers 1520 and a plurality of metallization layers 1540 stacked alternately. The formation and material of the polymer dielectric layers 1520 may be identical or similar to the formation and material of the polymer dielectric layers 1220 as described in FIG. 10, and the formation and material of the metallization layers 1540 may be identical or similar to the formation and material of the metallization layers 1240 as described in FIG. 10, and thus are not repeated herein for brevity. In certain embodiments, a topmost layer of the metallization layers 1540 may include a plurality of pads. In such embodiments, the above-mentioned pads may include a plurality of under-ball metallurgy (UBM) patterns 1540a for ball mount. However, the disclosure is not limited thereto. In an alternative embodiment, the topmost one of the metallization layers 1540 may include a plurality of UBM patterns 1540a for ball mount and/or a plurality of connection pads (not shown) for mounting of other semiconductor components, and the numbers of the UBM patterns 1540a and the number of the connection pads 1540b are not limited according to the disclosure. In some embodiments, the redistribution circuit structure 1500 may be referred to as a back-side redistribution layer of the semiconductor die 200A.

In some embodiments, the conductive terminals 1600 may be placed on the UBM patterns 1540a through ball placement process and/or reflow process, or other suitable forming method. In some embodiments, the conductive terminals 1600 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The material of the conductive terminals 1600, for example, may include a conductive material such as solder, copper, aluminum, gold, nickel, silver, palladium, tin, or the like, or a combination thereof. In one embodiment, the material of the conductive terminals 1600, for example, may be solder-free. In some embodiments, through the redistribution circuit structure 1500, the UBM patterns 1540a, the conductive pillars 1300 and the redistribution circuit structure 1200, some of conductive terminals 1600 are electrically connected to the semiconductor die 200A. In some embodiments, through the redistribution circuit structure 1500 and the UBM patterns 1540a, some of conductive terminals 1600 are electrically connected to the conductive pillars 1300. In some embodiments, through the redistribution circuit structure 1500, the UBM patterns 1540a, and the conductive pillars 1300, some of the conductive terminals 1600 are electrically connected to the redistribution circuit structure 1200. In certain embodiments, some of the conductive terminals 1600 may be electrically floated or grounded, the disclosure is not limited thereto.

After the formation of the conductive terminals 1600, in some embodiments, a dicing process is performed to cut through the redistribution circuit structure 1500, the insulating encapsulation 1400 and the redistribution circuit structure 1200 to obtain individual and separated semiconductor packages SP1. In one embodiment, the dicing process is a wafer dicing process including mechanical blade sawing or laser cutting. Up to here, the manufacture of the semiconductor package SP1 is completed. During the dicing process, a holding device (not shown) is adopted to secure a workpiece including a plurality of the semiconductor packages SP1 interconnected thereto before cutting the workpiece to prevent damages caused by the sequential process(es) or transportation. For example, the holding device may be an adhesive tape, a carrier film or a suction pad. Alternatively, after the dicing process, the carrier 1120 may be detached from the redistribution circuit structure 1200 through a debonding process, where the carrier 1120 and the debond layer 1140 may be removed and the redistribution circuit structure 1200 may be exposed. The semiconductor package SP1 may be referred to as an InFO package.

The semiconductor package SP1 may be further mounted with a circuit substrate, an interposer, an additional package, chips/dies or other electronic devices to form a stacked package structure through the conductive terminals 1600 and/or other additional connectors based on the design layout and the demand. For illustration, examples are provided as follows (e.g., a semiconductor package SP2 of FIG. 12, a semiconductor package SP3 of FIG. 13 and a semiconductor package SP4 of FIG. 14), but the disclosure is not limited thereto. The elements similar to or substantially the same as the elements described previously will use the same reference numbers, and certain details or descriptions (e.g.

the materials, formation processes, positioning configurations, etc.) of the same elements would not be repeated herein.

Figure 12:
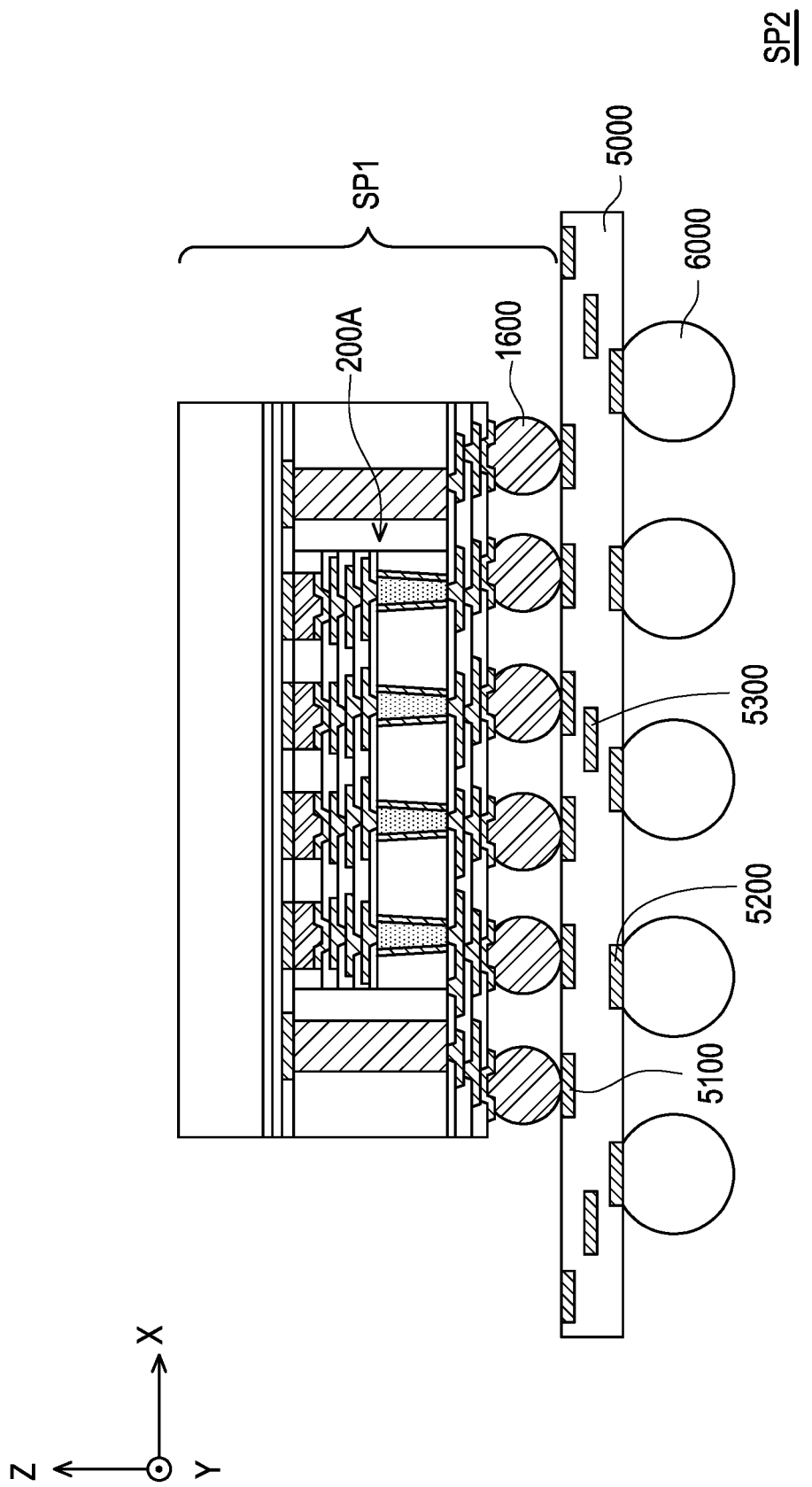
FIG. 12 through FIG. 14 are respectively schematic cross-sectional views of a semiconductor device in accordance with some alternative embodiments of the disclosure.

Referring to FIG. 12, in some embodiments, a substrate 5000 is provided. In some embodiments, the substrate 5000 includes contact pads 5100, contact pads 5200, metallization layers 5300, and vias (not shown). In some embodiments, the contact pads 5100 and the contact pads 5200 are respectively distributed on two opposite sides of the substrate 5000, and are exposed for electrically connecting with later-formed elements/features. In some embodiments, the metallization layers 5300 and the vias are embedded in the substrate 5000 and together provide routing function for the substrate 5000, where the metallization layers 5300 and the vias are electrically connected to the contact pads 5100 and the contact pads 5200. That is, at least some of the contact pads 5100 are electrically connected to some of the contact pads 5200 through the metallization layers 5300 and the vias. In some embodiments, the contact pads 5100 and the contact pads 5200 may include metal pads or metal alloy pads. In some embodiments, the materials of the metallization layers 5300 and the vias may be substantially the same or similar to the material of the contact pads 5100 and/or 5200, and thus are not repeated herein for simplicity.

In some embodiments, as shown in FIG. 12, the semiconductor package SP1 depicted in FIG. 11 is bonded to the substrate 5000 through physically connecting the conductive terminals 1600 and the contact pads 5100 to form the semiconductor package SP2 having a stacked structure, where the semiconductor package SP1 is physically and electrically connected to the substrate 5000. The detail of the semiconductor package SP1 has been previously described in FIG. 1 to FIG. 11, and thus are not repeated herein. In some embodiments, the substrate 5000 is referred to as a circuit substrate, such as an organic flexible substrate or a printed circuit board. In such embodiments, the conductive terminals 1600 are, for example, chip connectors or BGA balls.

In some embodiments, a plurality of conductive terminals 6000 are respectively formed on the substrate 5000. As shown in FIG. 12, for example, the conductive terminals 6000 are connected to the contact pads 5200 of the substrate 5000. In other words, the conductive terminals 6000 are electrically connected to the substrate 5000 through the contact pads 5200. Through the contact pads 5100 and the contact pads 5200, some of the conductive terminals 6000 are electrically connected to the semiconductor package SP1 (e.g. the semiconductor die 200A included therein). In some embodiments, the conductive terminals 6000 are, for example, solder balls or BGA balls. In some embodiments, the semiconductor package SP1 is bonded to the substrate 5000 through physically connecting the conductive terminals 1600 and the contact pads 5100 of the substrate 5000 by flip chip bonding. The semiconductor package SP2 may be referred to as a flip chip package (with an InFO package).

Figure 13:
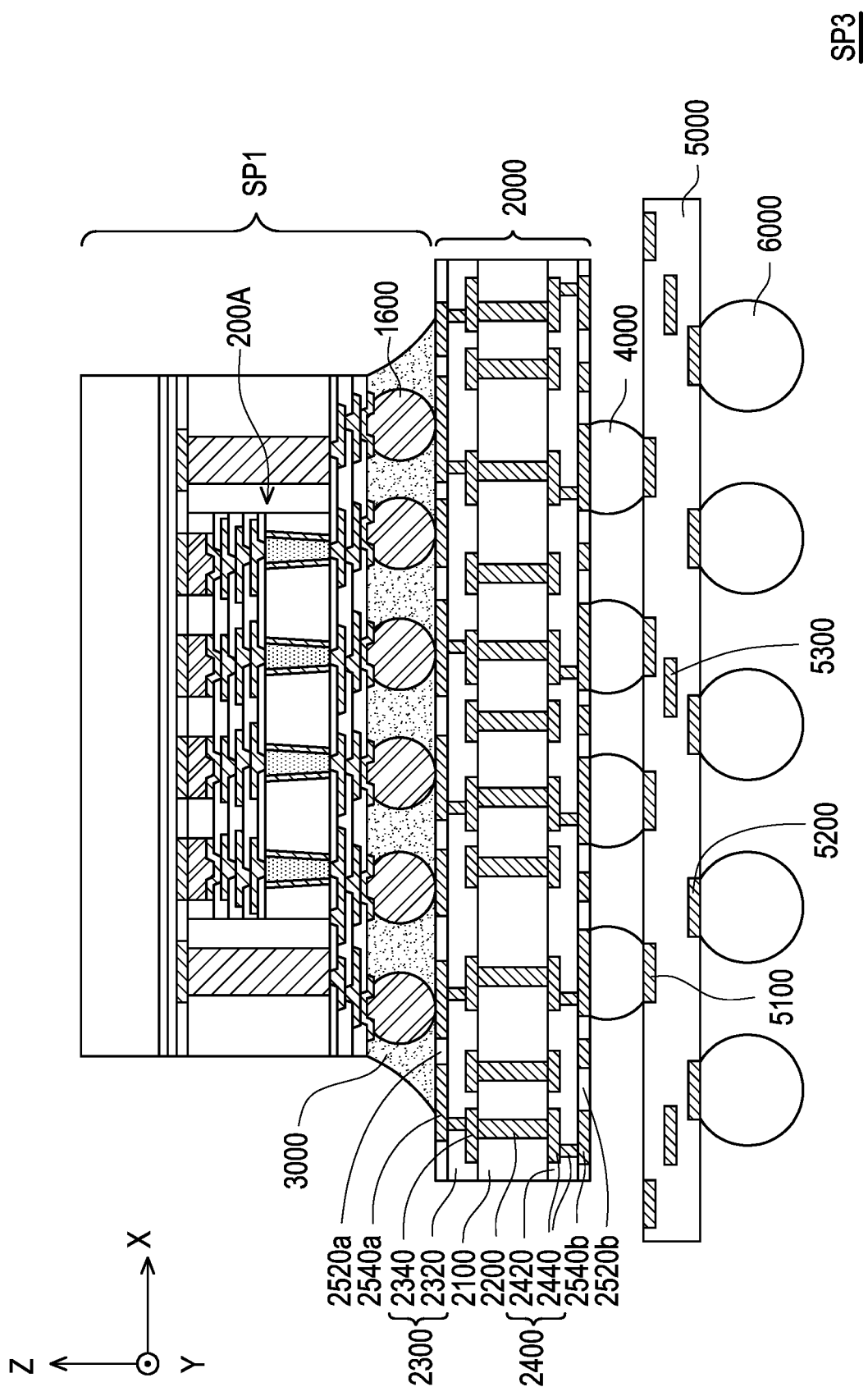

Referring to FIG. 13, in some embodiments, a circuit element 2000 is provided. In some embodiments, the circuit element 2000 includes a core portion 2100, a plurality of vias 2200, a redistribution circuit structure 2300, a redistribution circuit structure 2400, a solder mask layer 2520a, a solder mask layer 2520b, a plurality of bonding pads 2540a, and a plurality of bonding pads 2540b. In some embodiments, the core portion 2100 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 2200 is through silicon vias penetrating the core portions 2100. The circuit element 2000 is referred to as an interposer (see FIG. 13), in the disclosure.

In some embodiments, the redistribution circuit structure 2300 and the redistribution circuit structure 2400 respectively disposed on two opposite sides of the core portion 2100, as shown in FIG. 13. In some embodiments, the redistribution circuit structure 2300 and/or the redistribution circuit structure 2400 are electrically connected to the vias 2200 penetrating the core portion 2100. The core portion 2100 embedded with the vias 2200 is located between the redistribution circuit structure 2300 and the redistribution circuit structure 2400, in some embodiments. Through the vias 2200, the redistribution circuit structure 2300 and the redistribution circuit structure 2400 are electrically connected to each other.

In some embodiments, the redistribution circuit structure 2300 includes sequentially forming one or more dielectric layers 2320 and one or more metallization layers 2340 in alternation, where one metallization layer 2340 is sandwiched between two dielectric layers 2320. As shown in FIG. 13, portions of a top surface of a topmost layer of the metallization layers 2340 are respectively exposed by openings formed in a topmost layer of the dielectric layers 2320 for connecting with other conductive features, and portions of a bottom surface of a bottommost layer of the metallization layers 2340 are respectively exposed by openings formed in a bottommost layer of the dielectric layers 2320 for connecting with the vias 2200. The numbers of the dielectric layers 2320 and the metallization layers 2340 included in the redistribution circuit structure 2300 are not limited thereto, and may be designated and selected based on the demand.

In some embodiments, the redistribution circuit structure 2400 includes sequentially forming one or more dielectric layers 2420 and one or more metallization layers 2440 in alternation, where one metallization layer 2440 is sandwiched between two dielectric layers 2420. As shown in FIG. 13, portions of a top surface of a topmost layer of the metallization layers 2440 are respectively exposed by openings formed in a topmost layer of the dielectric layers 2420 for connecting with the vias 2200, and portions of a bottom surface of a bottommost layer of the metallization layers 2440 are respectively exposed by openings formed in a bottommost layer of the dielectric layers 2420 for connecting with other conductive features. The numbers of the dielectric layers 2420 and the metallization layers 2440 included in the redistribution circuit structure 2400 are not limited thereto, and may be designated and selected based on the demand.

In certain embodiments, the materials of the dielectric layers 2320 and the dielectric layers 2420 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 2320 and the dielectric layers 2420 formed by suitable fabrication techniques such as spin-on coating, CVD, PECVD, or the like. The disclosure is not limited thereto. In one embodiment, the materials of the dielectric layers 2320 and the dielectric layers 2420 may be the same. In an alternative embodiment, the materials of the dielectric layers 2320 and the dielectric layers 2420 may be different.

In certain embodiments, the material of the metallization layers 2340 and the metallization layers 2440 may be made of conductive materials formed by electroplating or deposition, such as aluminum, titanium, copper, nickel, tungsten, and/or alloys thereof, which may be patterned using a photolithography and etching process. In some embodiments, the metallization layers 2340 and the metallization layers 2440 may be patterned copper layers or other suitable patterned metal layers. In one embodiment, the materials of the metallization layers 2340 and the metallization layers 2440 may be the same. In an alternative embodiment, the materials of the metallization layers 2340 and the metallization layers 2440 may be different.

In some embodiments, the bonding pads 2540a are disposed on a surface of the redistribution circuit structure 2300 and physically connected to the portions of the top surface of the topmost layer of the metallization layers 2340 exposed by the openings formed in the topmost layer of the dielectric layers 2320, where the bonding pads 2540a are physically separated from each other through the solder mask layer 2520a formed on the surface of the redistribution circuit structure 2300 with the bonding pads 2540a disposed thereon. Through the redistribution circuit structure 2300, the bonding pads 2540a are electrically connected to the vias 2200 embedded in the core portion 2100.

In some embodiments, the bonding pads 2540b are disposed on a surface of the redistribution circuit structure 2400 and physically connected to the portions of the bottom surface of the bottommost layer of the metallization layers 2440 exposed by the openings formed in the bottommost layer of the dielectric layers 2420, where the bonding pads 2540b are physically separated from each other through the solder mask layer 2520b formed on the surface of the redistribution circuit structure 2400 with the bonding pads 2540b disposed thereon. Through the redistribution circuit structure 2400, the bonding pads 2540b are electrically connected to the vias 2200 embedded in the core portion 2100.

As shown in FIG. 13, for example, the bonding pads 2540a are electrically connected to the redistribution circuit structure 2300, and the bonding pads 2540b are electrically connected to the redistribution circuit structure 2400. In some embodiments, the bonding pads 2540a and the bonding pads 2540b may include under bump metallurgies (UBMs), however the disclosure is not limited thereto. As shown in FIG. 13, the bonding pads 2540a and the bonding pads 2540b are electrically connected to each other though the vias 2200, the redistribution circuit structure 2300, and redistribution circuit structure 2400, for example.

In an alternative embodiment, the redistribution circuit structure 2300 and the redistribution circuit structure 2400, one or both, may be omitted from the circuit element 200, the disclosure is not limited thereto. That is, for example, the circuit element 2000 may include a core portion 2100, a plurality of vias 2200, a solder mask layer 2520a, a solder mask layer 2520b, a plurality of bonding pads 2540a, and a plurality of bonding pads 2540b, where the bonding pads 2540a and the bonding pads 2540b are electrically connected to each other though the vias 2200.

In some embodiments, a plurality of conductive terminals 4000 are respectively formed on the bonding pads 2540b. As shown in FIG. 13, for example, the conductive terminals 4000 are physically connected to the bonding pads 2540b. In other words, the conductive terminals 4000 are electrically connected to the circuit element 2000 through the bonding pads 2540b. Through the bonding pads 2540b, some of the conductive terminals 4000 are electrically connected to some of the bonding pads 2540a. In some embodiments, the conductive terminals 4000 are, for example, chip connectors or BGA balls.

Continued on FIG. 13, in some embodiments, the semiconductor package SP1 depicted in FIG. 11 is provided and bonded to the circuit element 2000, and the circuit element 2000 is bonded to the substrate 5000 to form the semiconductor package SP3 having a stacked structure. The detail of the semiconductor package SP1 has been previously described in FIG. 1 to FIG. 11, and the detail of the substrate 5000 has been previously described in FIG. 12, and thus are not repeated herein. In some embodiments, the semiconductor package SP1 is physically connected to the circuit element 2000 through connecting the conductive terminals 1600 and the bonding pads 2540a of the circuit element 2000, and the circuit element 2000 is physically connected to the substrate 5000 through connecting the conductive terminals 4000 and the contact pads 5100 of the substrate 5000. In other words, the semiconductor package SP1 is electrically connected to the circuit element 2000 through the conductive terminals 1600 and the bonding pads 2540a, the circuit element 2000 is electrically connected to the substrate 5000 through the conductive terminals 4000 and the contact pads 5100, so that the semiconductor package SP1 is electrically connected to the substrate 5000 through the conductive terminals 1600, the bonding pads 2540a, the conductive terminals 4000 and the contact pads 5100. In such embodiments, the conductive terminals 1600 are, for example, micro-bumps while the conductive terminals 4000 are chip connectors and the conductive terminals 6000 are solder balls or BGA balls. In certain embodiments, the semiconductor package SP3 depicted in FIG. 13 may be formed by chip on wafer on substrate (CoWoS) packaging processes. The semiconductor package SP3 may be referred to as a CoWoS package.

In some embodiments, an underfill 3000 is optimally formed on the circuit element 2000. As shown in FIG. 13, for example, the underfill 3000 at least fills the gaps between the semiconductor package SP1 and the circuit element 2000, and wraps sidewalls of the conductive terminals 1600. In some alternative embodiments, a sidewall of the semiconductor package SP1 may further covered by the underfill 3000, the disclosure is not limited thereto. The underfill 3000 may be any acceptable material, such as a polymer, epoxy, molding underfill, or the like, for example. In one embodiment, the underfill 3000 may be formed by underfill dispensing or any other suitable method. Owing to the underfill 3000, the bonding strength between the semiconductor package SP1 and the circuit element 2000 are enhanced, thereby improving the reliability of the package structure P5.

Figure 14:
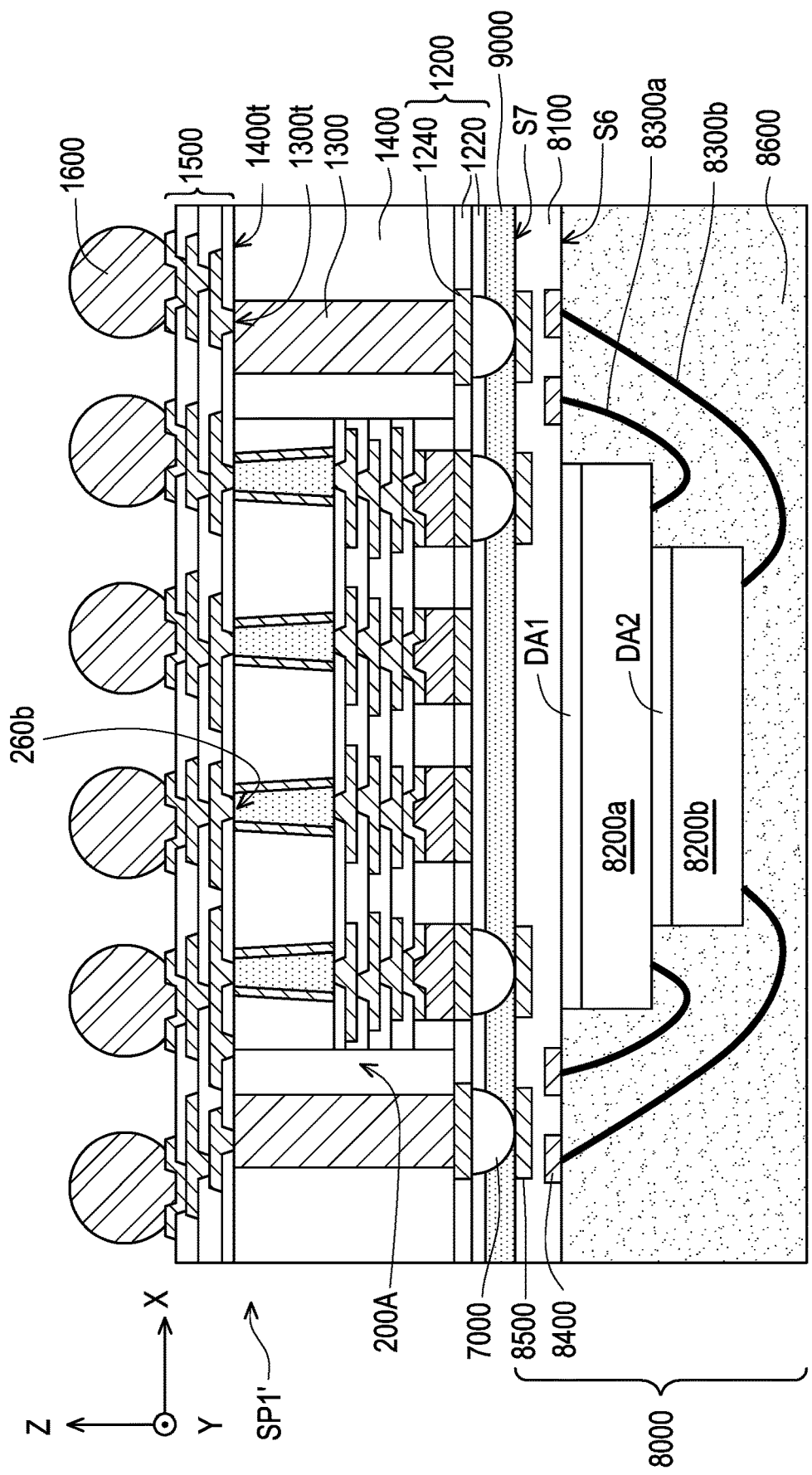

Referring to FIG. 14, in some embodiments, the semiconductor package SP1 depicted in FIG. 11 is debonded from the carrier 1120 and the debond layer 1140, and a plurality of conductive terminals 7000 are disposed on and electrically connected to the redistribution circuit structure 1200 to form a semiconductor package SP1', where the semiconductor package SP1' is bonded to a package 8000 to form the semiconductor package SP4. The detail of the semiconductor package SP1' is similar to or substantially identical to the detail of the semiconductor package SP1 as described in FIG. 1 to FIG. 11, and thus are not repeated herein. In some embodiments, the redistribution circuit structure 1200 exposed from the debonding step is patterned to expose portions of the metallization layer 1240. In some embodiments, the bottommost layer of the polymer dielectric layers 1220 is patterned to form a plurality of openings (not labelled) respectively exposing portions of a bottom surface of the metallization layer 1240, and the conductive terminals 7000 are connected to the redistribution circuit structure 1200 through the openings formed in the bottommost layer of the polymer dielectric layers 1220. The patterning step may, for example, include a laser drilling process; however, the disclosure is not limited thereto. The number of the openings is not limited thereto, and may be designated and selected based on the demand.

In some embodiments, the package 8000 includes a substrate 8100, semiconductor dies 8200a and 8200b, bonding wires 8300a and 8300b, conductive pads 8400, conductive pads 8500, an insulating encapsulation 8600, and joining solder balls (not shown). As shown in FIG. 14, for example, the semiconductor die 8200a with a connecting film DA1 disposed thereon and the semiconductor die 8200b with a connecting film DA2 are provided and are disposed on the substrate 8100. In some embodiments, the connecting film DA1 is located between the semiconductor die 2200a and the substrate 8100, and the connecting film DA2 is located between the semiconductor die 2200a and the semiconductor die 2200b. In some embodiments, due to the connecting films D1 and DA2 respectively provided between the semiconductor die 8200a and the substrate 8100 and between the semiconductor dies 8200a and 8200b, the semiconductor dies 8200a, 8200b are stably adhered to the substrate 8100. In some embodiments, the connecting films D1, DA2 may be, for example, a die attach film, a layer made of adhesives or epoxy resin, or the like.

For example, the semiconductor dies 8200a and 8200b are mounted on one surface (e.g. a surface S6) of the substrate 8100. In some embodiments, the semiconductor dies 8200a and 8200b may be logic chips (e.g., CPU, GPU, NPU, DPU, TPU SoC, AP, microcontrollers, etc.), memory chips (e.g., DRAM chips, SRAM chips, etc.), power management chips (e.g., PMIC chips), RF chips, BB chips, sensor chips, MEMS chips, signal processing chips (e.g., DSP chips), front-end chips (e.g., AFE chips), application-specific die (e.g., ASIC), FPGA; a combination thereof; or the like. The semiconductor dies 8200a and 8200b are DRAM chips, as shown in FIG. 14, for example. In one embodiment, the semiconductor dies 8200a and 8200b may be the same. However, the disclosure is not limited thereto; in an alternative embodiment, the semiconductor dies 8200a and 8200b may be different from each other.

In some embodiments, the bonding wires 8300a and 8300b are respectively used to provide electrical connections between the semiconductor dies 8200a, 8200b and some of the conductive pads 8400 (such as bonding pads) located on the surface S6 of the substrate 8100. Owing to the bonding wires 8300a and 8300b, the semiconductor dies 8200a and 8200b are electrically connected to the substrate 8100.

In some embodiments, the insulating encapsulation 8600 is formed on the surface S6 of the substrate 8100 to encapsulate the semiconductor dies 8200a, 8200b, the bonding wires 8300a, 8300b, and the conductive pads 840 to protect these components. In some embodiments, the materials of the insulating encapsulation 8600 is the same as the insulating encapsulation 1400, and thus is not repeated herein. In one embodiment, the materials of the insulating encapsulation 8600 is different from the insulating encapsulation 1400, the disclosure is not limited thereto.

In some embodiments, interconnects (not shown) or through insulator vias (not shown) embedded in the substrate 8100 may be used to provide electrical connection between the conductive pads 8400 and the conductive pads 8500 (such as bonding pads) that are located on another surface (e.g. a surface S7 opposite to the surface S6) of the substrate 8100. In certain embodiments, some of the conductive pads 8500 are electrically connected to the semiconductor dies 8200a and 8200b through these through insulator vias or interconnects (not shown) in addition to some of the conductive pads 8400 and the bonding wires 8300a, 8300b.

In some embodiments, the conductive pads 8500 of the package 8000 are electrically connected to the conductive pillars 1300 through connecting the joining solder balls (not shown) formed on the conductive pads 8500 of the package 8000 and the conductive terminals 7000 of the semiconductor package SP1'. After bonding, the joining solder balls and the conductive terminals 7000 may be collectively referred to as joints 7000 hereinafter. That is, the semiconductor package SP1' and the package 8000 are electrically connected and physically connected through the joints 7000 sandwiched therebetween, where the semiconductor dies 8200a, 8200b are electrically connected to the semiconductor package SP1'. In other words, the semiconductor dies 8200a, 8200b are electrically communicated to the semiconductor die 200A of the semiconductor package SP1'.

In addition, as shown in FIG. 14, an underfill 9000 fills the gaps between the package 8000 and the semiconductor package SP1' and between the joints 7000, and further encapsulates the joints 7000, for example. In one embodiment, the underfill 9000 may be formed by underfill dispensing or any other suitable method. In some embodiments, a material of the underfill 9000 may be the same or different from a material of the planarized insulating encapsulation 1400, a material of the insulating encapsulation 8600, and/or the material of the underfill 3000 as previously described, the disclosure is not limited thereto. Owing to the underfill 9000, a bonding strength of the semiconductor package SP4 is enhanced. The semiconductor package SP4 may be referred to as an InFO package of Package-on-Package (PoP) structure. Alternatively, the semiconductor package SP4 may be further bonded onto a circuit substrate (e.g. the substrate 5000) through the conductive terminals 1600 to form flip chip package with a PoP InFO package.

However, the disclosure is not limited thereto. The pickup apparatus 100A may be further employed during the manufacturing process of the semiconductor packages SP2, SP3 and SP4 for transferring the semiconductor packages SP1 and/or dies onto circuit substrates, interposers, additional packages, chips/dies or other electronic devices to form a stacked package structure.

Figure 22:
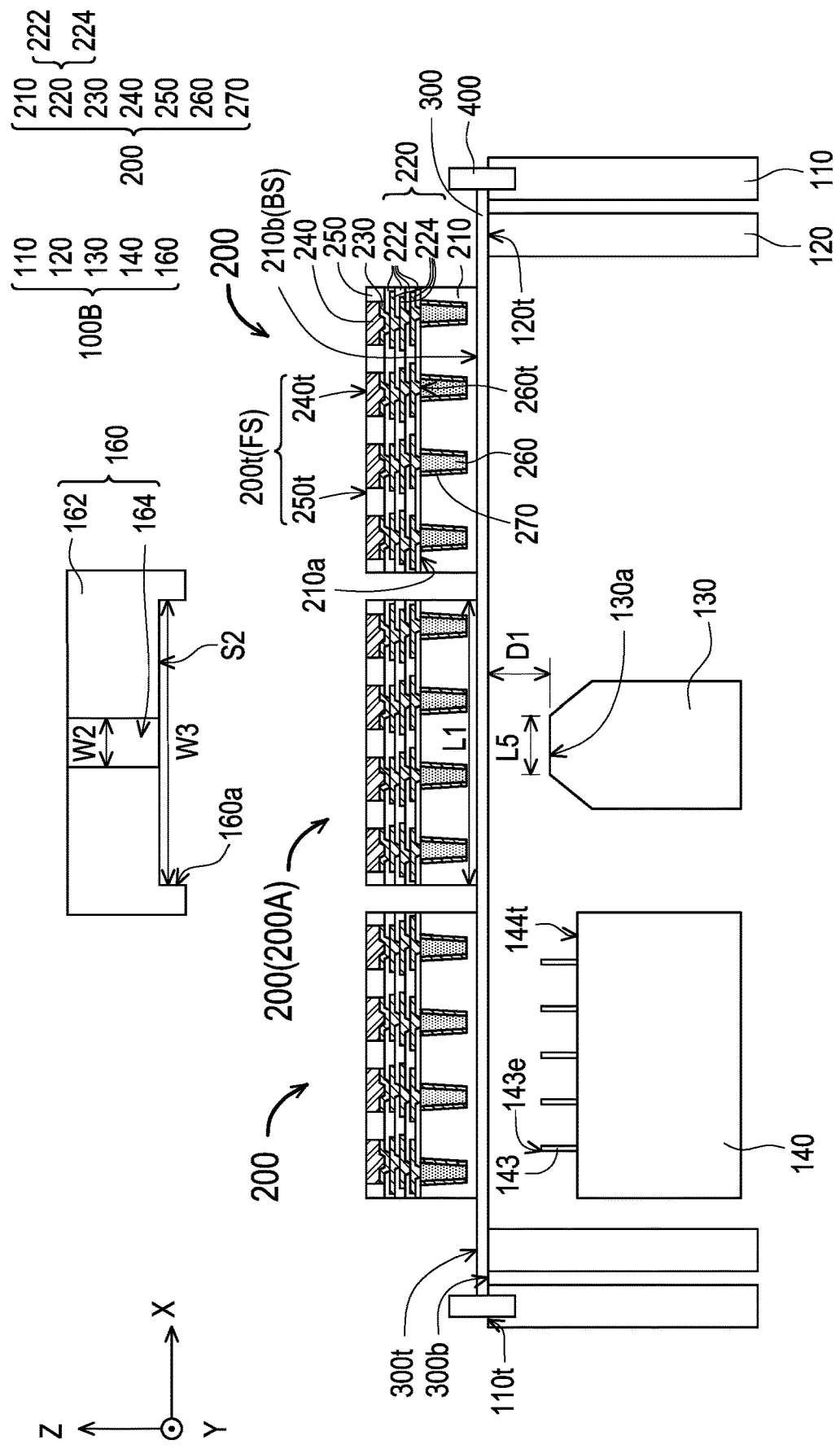
FIG. 22 is a schematic cross-sectional view showing a pickup apparatus during manufacturing a semiconductor device in accordance with some alternative embodiments of the disclosure.

FIG. 22 is a schematic cross-sectional view showing a pickup apparatus during manufacturing a semiconductor device in accordance with some alternative embodiments of the disclosure. The elements similar to or substantially the same as the elements described previously will use the same reference numbers, and certain details or descriptions (e.g. the materials, formation processes, positioning configurations, etc.) of the same elements would not be repeated herein. In some embodiments, a pickup apparatus 100B of FIG. 22 is similar to the pickup apparatus 100A of FIG. 1 through FIG. 6; the difference is that, the pickup apparatus 100B includes a first frame element 110, a second frame element 120, a light emitting element 130, an ejector element 140 and a collector element 160. In other words, the collector element 150 is substituted by the collector element 160, in the pickup apparatus 100B.

In some embodiments, the collector element 160 includes a body 162 having a recess 160a, a channel 164 embedded therein, and a vacuum element (not shown) connected to the channel 164, as shown in FIG. 22. In some embodiments, the vacuum element is configured to provide a vacuum force (e.g., generating a negative pressure) to the channel 164 for picking up the semiconductor die 200A. The channel 164 may be referred to as a vacuum path or a vacuum channel. For example, the channel 164 has an opening hole (not labelled, having a width W2) at a surface S2 of the body 162, where the surface S2 is facing to the semiconductor dies 200 and is a bottom surface of the recess 160a. The recess 160a formed in the body 162 may have an opening hole facing to the semiconductor dies 200, and the opening hole is opposite to the surface S2, as shown in FIG. 22. In some embodiments, a size W3 of the recess 160a is greater than the size (e.g. the first lateral size L1 and the second lateral size L2) of the semiconductor die 200A, such that the recess 160a is capable of accommodating a portion of the semiconductor die 200A. In other words, the semiconductor die 200A may be partially inserted into the recess 160a without contacting the body 162. In some embodiments, the size W3 of the recess 160a is greater than the width W2 of the channel 164 and the width W1 of the channel 154.

For example, during the pick-up process (e.g., in the step S1040 of the method 1000 in FIG. 28), the collector element 160 is positioned in the first configuration (in respective with the semiconductor die 200A) and is moved down along the direction Z until at least a portion of the semiconductor die 200A is located inside the recess 160a without contacting the body 162. In some embodiments, with partially placing the semiconductor die 200A into the recess 160a, the semiconductor die 200A has a larger area undergoing a suction force, thereby ensuring there is sufficient suction force to stably hold the semiconductor die 200A by the collector element 160. The semiconductor die 200A may be held by the collector element 160 without contacting the body 162 during the pick-up process. That is, as the semiconductor die 200A is held by the collector element 160, there is no direct contact therebetween, for example. The collector element 160 may be referred to as a contactless mode collector. Owing to the collector element 160, a damage to (e.g. the front-side surface FS of) the semiconductor die 200 (e.g., 200A) caused by residues (e.g. undesired particles) on the surface S2 of the collector element 160 can be avoid.

In some embodiments, the collector element 160 is accurately moved to a position right overlying the semiconductor die 200A (e.g., the first configuration in respect with the semiconductor die 200A) by using an optical microscope (e.g. a detection of an intensity of light reflection of an alignment mark on the semiconductor die 200A) to determine the location of the semiconductor die 200A. In other words, the pickup apparatus 100A may include one or more than one optical microscope integrated in the collector element 160 or one or more than one optical microscope installed onto the moving mechanism next to the collector element 160. The alignment mark may include one or more metallic patterns formed on or in the semiconductor die 200A. The alignment mark may include one or more metallic patterns formed on or in the semiconductor die 200A. In some embodiments, the pickup apparatus 100A further includes a moving mechanism, where the collector element 160 is connected to the moving mechanism (not shown) to control the movement of the collector element 160. For example, the moving mechanism is configured to move the collector element 160 vertically along the direction Z and/or horizontally along the direction X and/or Y. The moving mechanism may include a mechanical arm.

In some embodiments, a material of the body 162 includes a metallic material, such as metal or metal alloy. The material of the body 162 may be the same as the material of the body 152. The disclosure is not limited thereto; alternatively, the material of the body 162 may be different from the material of the body 152. The details of the first frame element 110, the second frame 120, the light emitting element 130, the ejector elements and the semiconductor dies 200/200A have been previously described in FIG. 1, and thus are not repeated herein for brevity. Owing to the light emitting element 130 and the ejector element 140 of the pickup apparatus 100B, the peeling strength between the second portion 320 and the semiconductor die 200 (e.g., 200A) disposed thereon is greatly decreased, thereby facilitating a pick-up of the semiconductor die 200 (e.g., 200A) from the second portion 320 and suppressing damages (such as a crack) to the semiconductor die 200 (e.g., 200A).

FIG. 23 through FIG. 26 are schematic cross-sectional views showing a method of using a pickup apparatus during manufacturing a semiconductor device in accordance with some embodiments of the disclosure. FIG. 27 is a schematic cross-sectional view showing a pickup apparatus during manufacturing a semiconductor device in accordance with some alternative embodiments of the disclosure. The elements similar to or substantially the same as the elements described previously will use the same reference numbers, and certain details or descriptions (e.g. the materials, formation processes, positioning configurations, etc.) of the same elements would not be repeated herein. In some embodiments, a pickup apparatus 100C of FIG. 23 through FIG. 26 is similar to the pickup apparatus 100A of FIG. 1 through FIG. 6; the difference is that, the pickup apparatus 100C includes a first frame element 110, a second frame element 120, a light emitting element 130, and a collector element 150. In other words, the ejector element 140 is omitted, in the pickup apparatus 100C. The details of the first frame element 110, the second frame 120, the light emitting element 130, and the collector element 150 have been previously described in FIG. 1 in conjunction with FIG. 16 through FIG. 21, and thus are not repeated herein for brevity.

Figure 23:
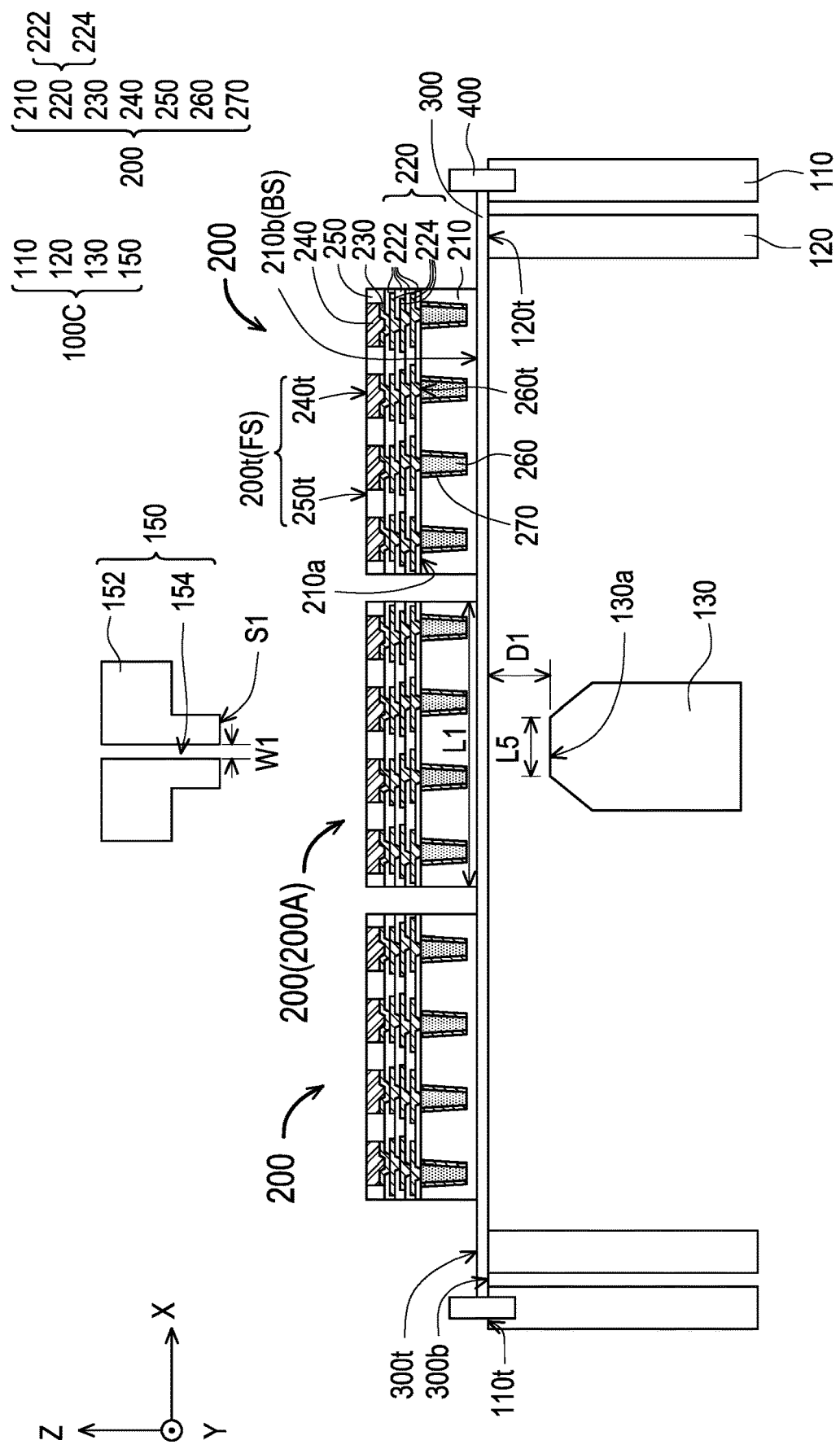
FIG. 23 through FIG. 26 are schematic cross-sectional views showing a method of using a pickup apparatus during manufacturing a semiconductor device in accordance with some embodiments of the disclosure.

Referring to FIG. 23, the semiconductor dies 200 adhered to the adhesive film 300 are placed onto the pickup apparatus 100C, in accordance with step S1010 of a method 1000 in FIG. 28. The adhesive film 300 may be fixed onto the pickup apparatus 100C through a loading element 400, where the loading element 400 may be disposed in or on the first frame element 110. The details of the semiconductor dies 200/200A, the adhesive film 300, and the loading element 400 have been previously described in FIG. 1, and thus are not repeated herein for brevity.

Figure 24:
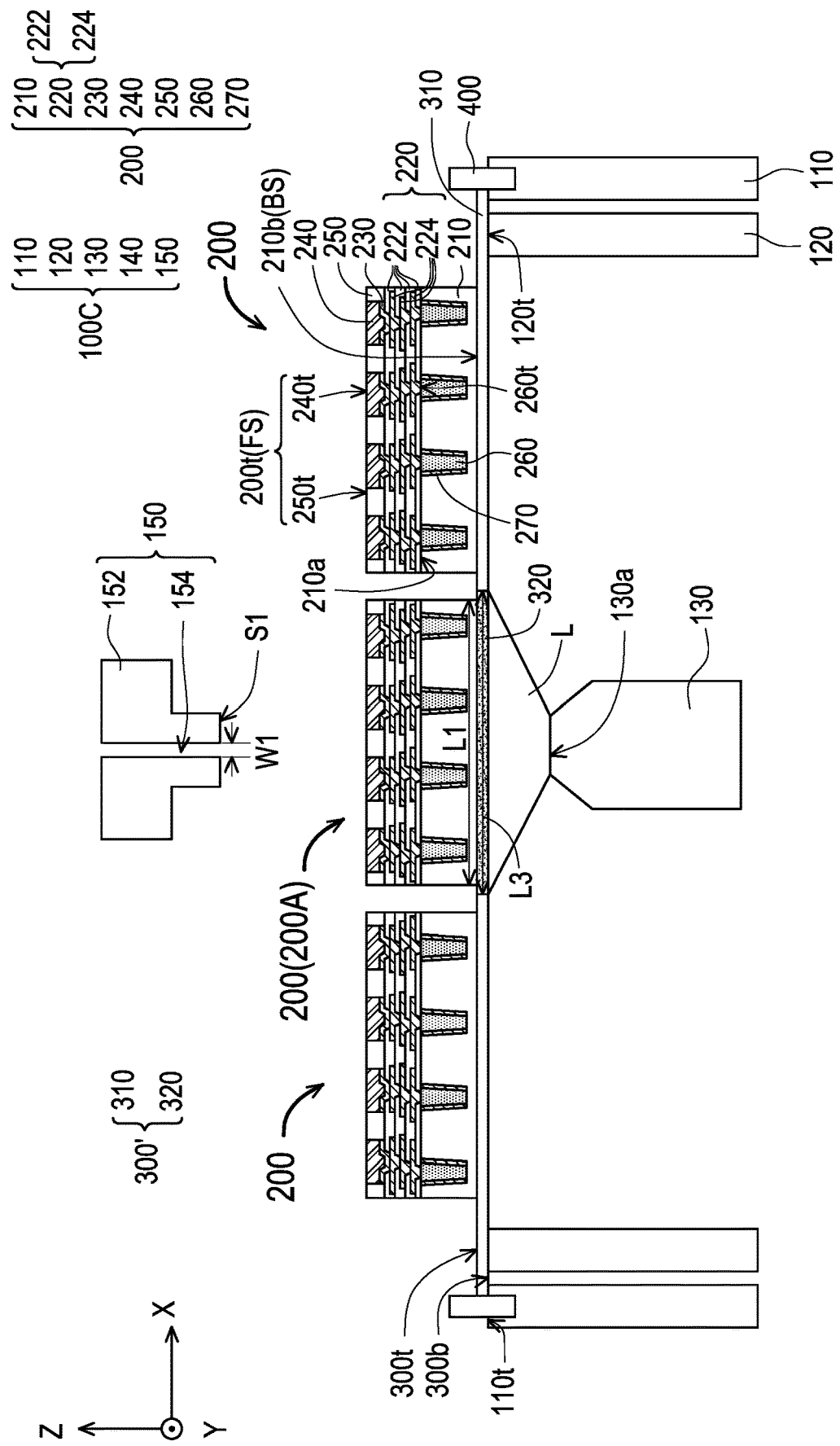

Referring to FIG. 24, in some embodiment, an UV light L is radiated onto the adhesive film 300, in accordance with a step S1020 of the method 1000 in FIG. 28. In some embodiments, the adhesive film 300 is partially radiated by the UV light L to form an adhesive film 300', where a portion of the adhesive film 300 not exposed to the UV light L forms a first portion 310 of the adhesive film 300' and a portion of the adhesive film 300 exposed to the UV light L forms a second portion 320 of the adhesive film 300'. As shown in FIG. 2, the adhesive film 300' is a continuous film, and the first portion 310 and the second portion 320 of the adhesive film 300' are connected to (e.g., in physical contact with) each other, for example. Since the second portion 320 is cured, the second portion 320 loses its adhesive property, thus the adhesion of the second portion 320 to the semiconductor die 200 (e.g., 200A) disposed thereon is sufficiently lowered while the adhesion of the first portion 310 to the semiconductor dies 200 (e.g., 200A) disposed thereon maintains the same (as the first portion 310 is not exposed to the UV light L). In certain embodiments, during the radiating process, the light emitting element 130, the semiconductor die 200A, and the collector element 150 are positioned in the first configuration. That is to say, the center of the light emitting element 130, the center of the semiconductor die 200A, and a center of the collector element 150 are substantially aligned with each other along the stacking direction Z, for example. The light emitting element 130, the semiconductor die 200A, and the collector element 150 may be overlapped with each other along the stacking direction Z, as shown in FIG. 2. The details of the radiating process and the adhesive film 300' have been previously described in FIG. 2 in conjunction with FIG. 15, and thus are not repeated herein for brevity.

Figure 25:
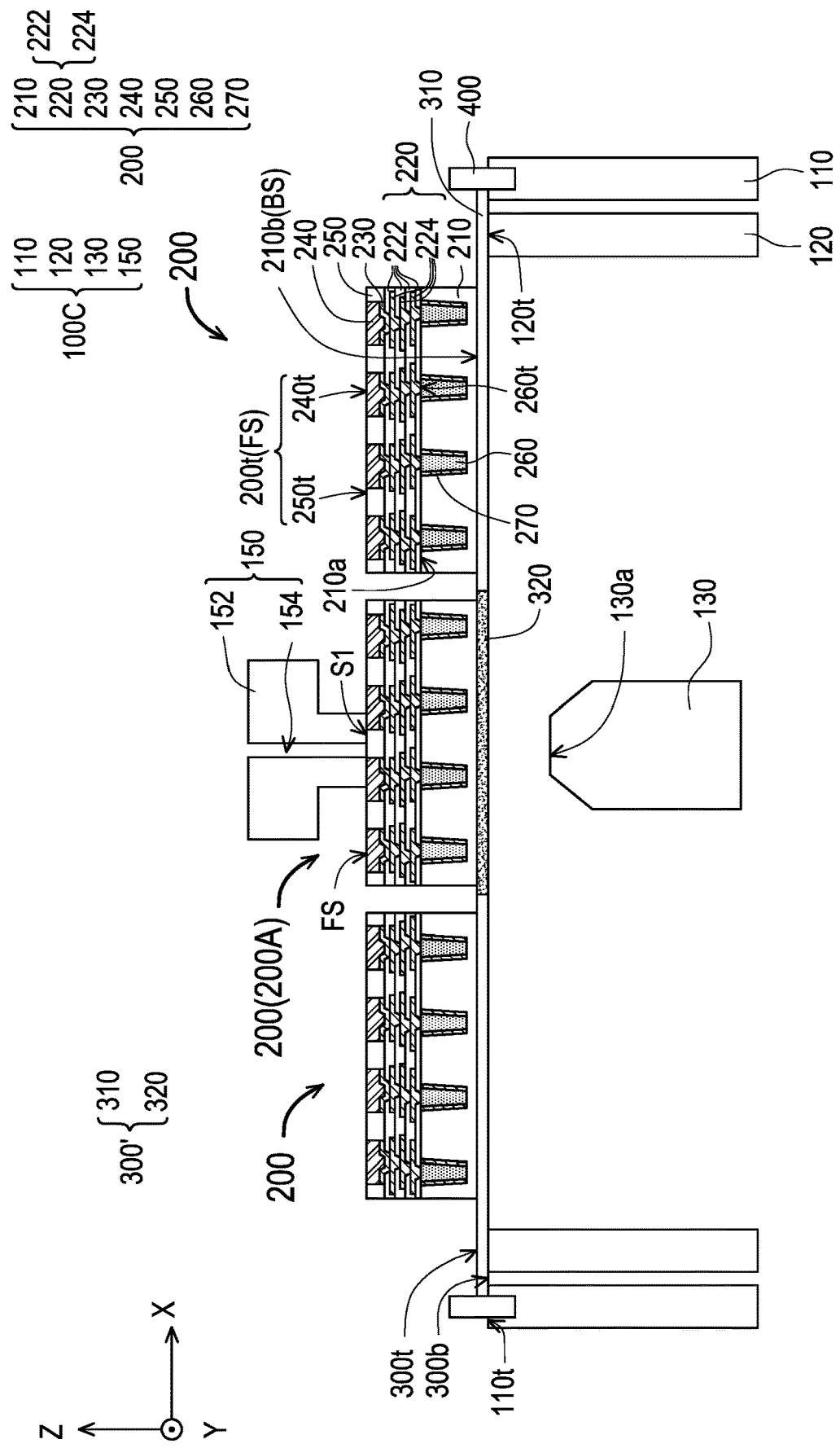
Figure 26:
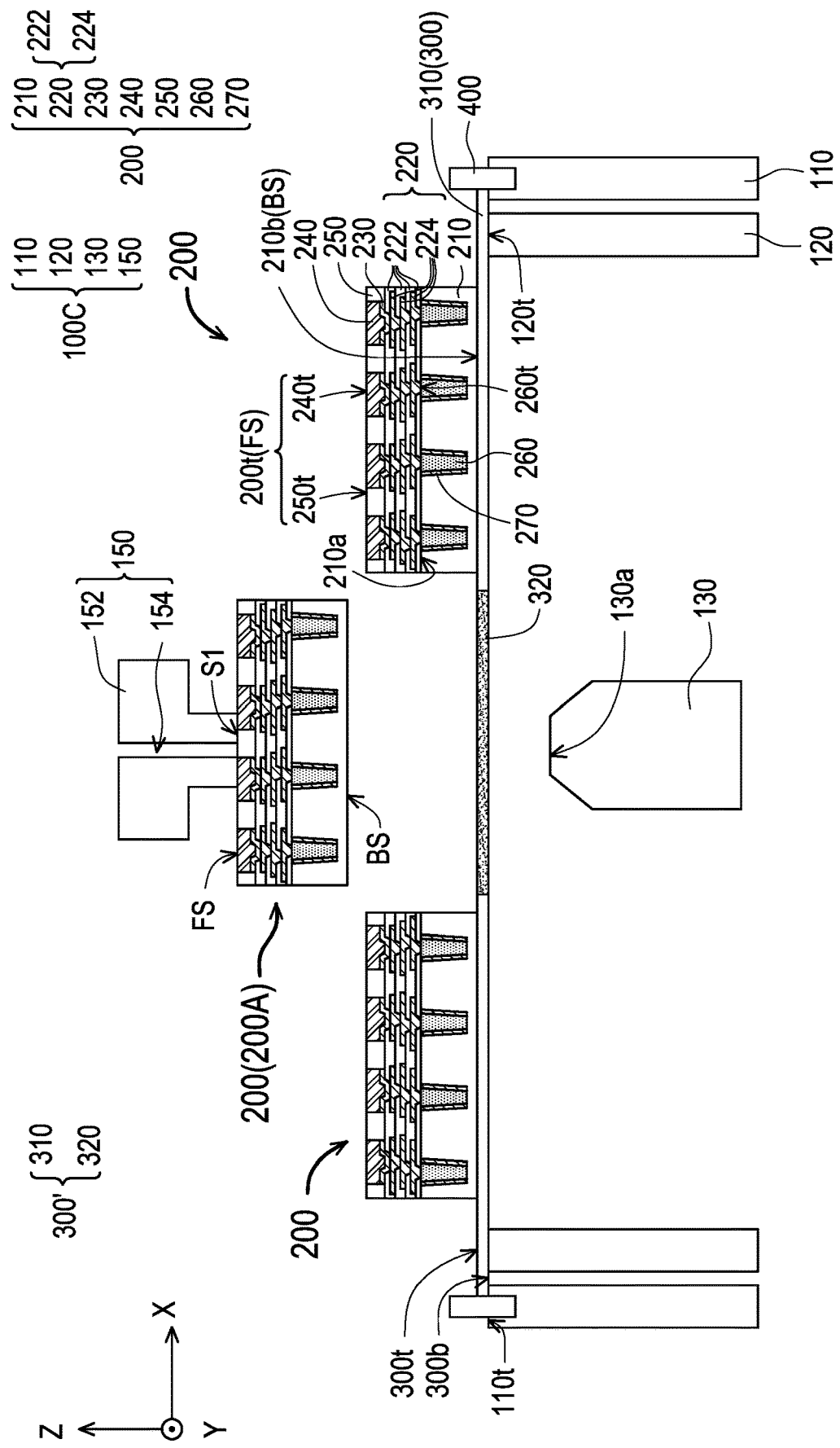
Figure 27:
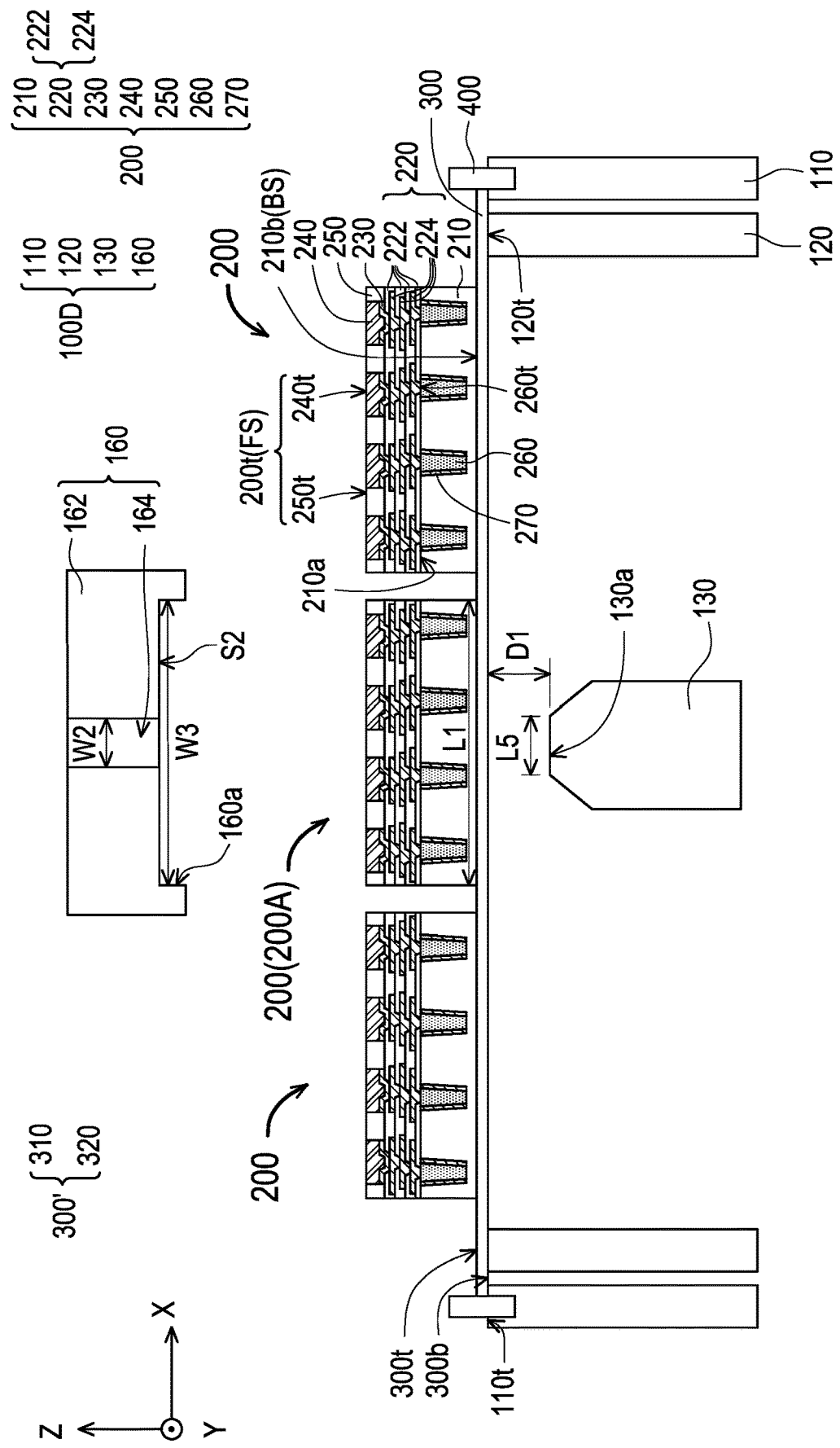
FIG. 27 is a schematic cross-sectional view showing a pickup apparatus during manufacturing a semiconductor device in accordance with some alternative embodiments of the disclosure.

Referring to FIG. 25 and FIG. 26, in some embodiment, the semiconductor die 200A is removed (e.g., picked up) from the adhesive film 300' by the collector element 150, in accordance with a step S1040 of the method 1000 in FIG. 28. For example, the collector element 150 is moved down along the direction Z until the surface S1 of the collector element 150 is in (physical) contact with the front-side surface FS of the semiconductor die 200A, and the collector element 150 applies a vacuum force on the semiconductor die 200A through the channel 154, such that the semiconductor die 200A is held by the collector element 150 by a suction force, as shown in FIG. 25. As the semiconductor die 200A is held by the collector element 150, there is a direct contact therebetween. The collector element 150 may be referred to as a contact mode collector. Thereafter, the collector element 150 is moved up along the direction Z, thereby the back-side surface BS of the semiconductor die 200A is completely peeled off from the top surface 300t of the second portion 320 of the adhesive film 300', as shown in FIG. 26, for example. Owing to the light emitting element 130, the peeling strength between the second portion 320 and the semiconductor die 200 (e.g., 200A) disposed thereon is greatly decreased, the contact force between the surface S1 of the collector element 150 and the semiconductor die 200 (e.g., 200A) used for holding the semiconductor die 200 (e.g., 200A) can be lowered, thereby a damage to (e.g. the front-side surface FS of) the semiconductor die 200 (e.g., 200A) caused by residues (e.g. undesired particles) on the surface S1 of the collector element 150 can be suppressed and/or avoid. In addition, owing to the light emitting element 130 of the pickup apparatus 100C, the peeling strength between the second portion 320 and the semiconductor die 200 (e.g., 200A) disposed thereon is greatly decreased, thereby facilitating a pick-up of the semiconductor die 200 (e.g., 200A) from the second portion 320 and suppressing damages (such as a crack) to the semiconductor die 200 (e.g., 200A).

Similarly, the collector element 150 of the pickup apparatus 100C may be substituted by a collector element 160, see a pickup apparatus 100D as shown in FIG. 27. The detail of the collector element 160 has been previously described in FIG. 22, and thus is not repeated herein for brevity. Owing to the collector element 160, a damage to (e.g. the front-side surface FS of) the semiconductor die 200 (e.g., 200A) caused by residues (e.g. undesired particles) on the surface S2 of the collector element 160 can be avoid. Owing to the light emitting element 130 of the pickup apparatus 100D, the peeling strength between the second portion 320 and the semiconductor die 200 (e.g., 200A) disposed thereon is greatly decreased, thereby facilitating a pick-up of the semiconductor die 200 (e.g., 200A) from the second portion 320 and suppressing damages (such as a crack) to the semiconductor die 200 (e.g., 200A).

In accordance with some embodiments, a pickup apparatus for separating a semiconductor die adhered on an adhesive film therefrom includes: a frame, configured to hold the adhesive film adhered with the semiconductor die thereon; an UV light emitting element, disposed inside the frame, the adhesive film being disposed between the semiconductor die and the UV light emitting element; and a collector element, disposed over the frame.

In accordance with some embodiments, a pickup apparatus for debonding a semiconductor die from an adhesion layer includes: a first frame element, configured to hold the adhesion layer adhered with the semiconductor die thereon; a second frame element, disposed inside the first frame element; a light emitting element, disposed inside the second frame element, the adhesion layer being disposed between the semiconductor die and the light emitting element; an ejector element, disposed inside the second frame element and next to the light emitting element, the adhesion layer being disposed between the semiconductor die and the ejector element; and a collector element, disposed over the first frame element and the second frame element.

In accordance with some embodiments, a method for separating a semiconductor die adhered on an adhesive film therefrom includes: providing a pickup apparatus comprising a frame, an UV light emitting element disposed inside the frame, and a collector element disposed over the frame; placing the semiconductor die adhered on the adhesive film onto the pickup apparatus through the frame; radiating an UV light onto a portion of the adhesive film underlying the semiconductor die via the UV light emitting element; and removing the semiconductor die from the portion of the adhesive film via the collector element.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method for separating a semiconductor die adhered on an adhesive film therefrom, comprising:
   providing a pickup apparatus comprising a frame, an UV light emitting element disposed inside the frame, and a collector element disposed over the frame;
   placing the semiconductor die adhered on the adhesive film onto the pickup apparatus through the frame;
   radiating an UV light onto a portion of the adhesive film underlying the semiconductor die via the UV light emitting element, the UV light emitting element being laterally overlapped with and laterally surrounded by the frame; and
   removing the semiconductor die being disposed between the adhesive film and the collector element from the portion of the adhesive film via the collector element.

2. The method of claim 1, wherein prior to radiating the UV light onto the portion of the adhesive film, the method further comprises aligning a center of the UV light emitting element with a center of the semiconductor die along a stacking direction of the UV light emitting element and the semiconductor die.

3. The method of claim 1, wherein radiating the UV light onto the portion of the adhesive film comprises radiating a UV light by a UV LED with a wavelength of about 10 nm to about 400 nm at an intensity of about 100 J/cm2 to about 1000 J/cm2.

4. The method of claim 1, wherein the pickup apparatus further comprises an ejector element, wherein prior to removing the semiconductor die from the portion of the adhesive film and after radiating the UV light onto the portion of the adhesive film, the method further comprises:
aligning a center of the ejector element with a center of the semiconductor die along a stacking direction of the ejector element and the semiconductor die; and
lifting the semiconductor die up by the ejector element.

5. The method of claim 4, wherein the ejector element comprises a plurality of lifting pins,
wherein lifting the semiconductor die up by the ejector element comprises moving the lifting pins upwards to push up the semiconductor die.

6. The method of claim 1, wherein removing the semiconductor die from the adhesive film by the collector element comprises removing the semiconductor die from the portion of the adhesive film by the collector element via a contact-less mode.

7. The method of claim 1, wherein removing the semiconductor die from the adhesive film by the collector element comprises removing the semiconductor die from the portion of the adhesive film by the collector element via a contact mode.

8. A pickup apparatus for separating a semiconductor die adhered on an adhesive film, comprising:
a frame, configured to hold the adhesive film adhered with the semiconductor die;
an UV light emitting element, disposed inside the frame, the adhesive film being disposed between the semiconductor die and the UV light emitting element, and the UV light emitting element being laterally overlapped with and laterally surrounded by the frame; and
a collector element, disposed over the frame to pick up the semiconductor die being disposed between the adhesive film and the collector element.

9. The pickup apparatus of claim 8, wherein the UV light emitting element comprises an UV LED lamp emitting an UV light having a wavelength of about 10 nm to about 400 nm at an intensity of about 100 J/cm$^2$ to about 1000 J/cm$^2$,
wherein the frame comprises a first frame and a second frame surrounded by the first frame, and the first frame and the second frame are extending along a stacking direction of the adhesive film and the semiconductor die.

10. The pickup apparatus of claim 8, wherein the UV light emitting element is spaced away from the adhesive film by a distance of about 1 mm to about 10 mm,
wherein the pickup apparatus further comprises:
a loading element, disposed over the frame and configured to clamp an edge of the adhesive film adhered with the semiconductor die so that the frame being capable of holding the adhesive film adhered with the semiconductor die through the loading element.

11. The pickup apparatus of claim 8, wherein the collector element comprises a contactless mode collector comprising a body having a side facing to the semiconductor die, a channel embedded therein and having a first opening at the first side, and a vacuum element connected to the channel, and the body comprises a recess formed at the side.

12. The pickup apparatus of claim 8, wherein the collector element comprises a contact mode collector comprising a body having a side facing to the semiconductor die, a channel embedded therein and having a first opening at the first side, and a vacuum element connected to the channel.

13. The pickup apparatus of claim 8, wherein a material of the frame comprises a metal or a metal alloy,
wherein the UV light emitting element is configured to radiate a portion of the adhesive film with the semiconductor die adhered thereon, wherein in a vertical projection along a stacking direction of the semiconductor die and the adhesive film, an area of the portion of the adhesive film radiated by the UV light emitting element is extended beyond an area of the semiconductor die disposed on the portion of the adhesive film.

14. A pickup apparatus for debonding a semiconductor die from an adhesion layer, comprising:
a first frame element, configured to hold the adhesion layer adhered with the semiconductor die;
a second frame element, disposed inside the first frame element;
a light emitting element, disposed inside the second frame element, the adhesion layer being disposed between the semiconductor die and the light emitting element, the light emitting element being laterally overlapped with and laterally surrounded by the first frame and the second frame;
an ejector element, disposed inside the second frame element and aside the light emitting element, the adhesion layer being disposed between the semiconductor die and the ejector element; and
a collector element, disposed over the first frame element and the second frame element to pick up the semiconductor die being disposed between the adhesive layer and the collector element.

15. The pickup apparatus of claim 14, wherein an inner sidewall of the first frame element is distant from an outer sidewall of the second frame element, and a material of the first frame element and a material of the second frame element comprise metal or metal alloy.

16. The pickup apparatus of claim 14, wherein the light emitting element comprises:
a first housing, having a light exiting port;
an UV light source, disposed in the first housing and is configured to emit an UV light; and
a lens unit, disposed in the first housing and comprising a brightness enhancement film, a light diffusion film, or a combination thereof, wherein the lens unit is disposed at a light path of the UV light emitted by the light source unit and located between the light source unit and the light exiting port of the first house.

17. The pickup apparatus of claim 14, wherein the ejector element comprises:
a second housing, having a first surface facing the adhesion layer with a plurality of openings formed therein;
a plurality of pins, disposed inside second housing and each comprising a portion protruding out of the first surface through a respective one of the plurality of openings; and
a motor, connected to the plurality of pins and configured to lift or lower the plurality of pins.

18. The pickup apparatus of claim 17, wherein the plurality of pins are arranged into a matrix of an alignment manner, a matrix of a stagger manner, or a pre-determined pattern with a concentric manner.

19. The pickup apparatus of claim 14, wherein the collector element comprises a contactless mode collector.

20. The pickup apparatus of claim 14, wherein the collector element comprises a contact mode collector.

\* \* \* \* \*